United States Patent
Choi et al.

(10) Patent No.: US 9,401,428 B2
(45) Date of Patent: Jul. 26, 2016

(54) SEMICONDUCTOR DEVICES INCLUDING GATE PATTERN, MULTI-CHANNEL ACTIVE PATTERN AND DIFFUSION LAYER

(71) Applicants: Kyung-In Choi, Suwon-si (KR); Gyeom Kim, Hwasung-si (KR); Hong-Sik Yoon, Seongnam-si (KR); Bon-Young Koo, Suwon-si (KR); Wook-Je Kim, Gwacheon-si (KR)

(72) Inventors: Kyung-In Choi, Suwon-si (KR); Gyeom Kim, Hwasung-si (KR); Hong-Sik Yoon, Seongnam-si (KR); Bon-Young Koo, Suwon-si (KR); Wook-Je Kim, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 71 days.

(21) Appl. No.: 13/795,778

(22) Filed: Mar. 12, 2013

(65) Prior Publication Data

US 2014/0217483 A1 Aug. 7, 2014

(51) Int. Cl.
| | |
|---|---|
| *H01L 29/76* | (2006.01) |
| *H01L 29/78* | (2006.01) |
| *H01L 21/8234* | (2006.01) |
| *H01L 21/8238* | (2006.01) |
| *H01L 29/66* | (2006.01) |

(52) U.S. Cl.
CPC ...... *H01L 29/785* (2013.01); *H01L 21/823431* (2013.01); *H01L 29/66545* (2013.01); *H01L 21/823821* (2013.01); *H01L 29/66795* (2013.01); *H01L 2924/13067* (2013.01)

(58) Field of Classification Search
CPC ............ H01L 29/785; H01L 29/66545; H01L 29/66795; H01L 29/7831; H01L 2924/13067; H01L 21/823431; H01L 21/823821; H01L 27/10826; H01L 27/10879
See application file for complete search history.

(56) References Cited

U.S. PATENT DOCUMENTS

| | | | |
|---|---|---|---|
| 7,105,390 B2 | 9/2006 | Brask et al. | |
| 7,326,976 B2 | 2/2008 | Anderson et al. | |
| 7,521,752 B2 | 4/2009 | Kinoshita et al. | |
| 7,662,679 B2 | 2/2010 | Izumida et al. | |
| 7,723,797 B2 | 5/2010 | Kim et al. | |
| 7,871,875 B2 | 1/2011 | Kim et al. | |
| 2005/0074972 A1 | 4/2005 | Saito | |
| 2006/0071275 A1* | 4/2006 | Brask .................... H01L 21/845 257/350 |
| 2007/0284583 A1 | 12/2007 | Saito | |
| 2008/0237655 A1 | 10/2008 | Nakabayashi et al. | |
| 2009/0014812 A1* | 1/2009 | Wang et al. ................... 257/392 |
| 2009/0057761 A1* | 3/2009 | Kim et al. ..................... 257/344 |
| 2009/0108358 A1* | 4/2009 | Lee ................................ 257/368 |
| 2010/0078728 A1* | 4/2010 | Li ................... H01L 21/823425 257/369 |
| 2010/0197094 A1 | 8/2010 | Kim et al. | |

(Continued)

FOREIGN PATENT DOCUMENTS

| | | |
|---|---|---|
| JP | 2005-116633 A | 4/2005 |
| JP | 2009-21456 A | 1/2009 |

(Continued)

*Primary Examiner* — Su C Kim
(74) *Attorney, Agent, or Firm* — Myers Bigel & Sibley, P.A.

(57) ABSTRACT

A semiconductor device includes a gate pattern on a substrate, a multi-channel active pattern under the gate pattern to cross the gate pattern and having a first region not overlapping the gate pattern and a second region overlapping the gate pattern, a diffusion layer in the multi-channel active pattern along the outer periphery of the first region and including an impurity having a concentration, and a liner on the multi-channel active pattern, the liner extending on lateral surfaces of the first region and not extending on a top surface of the first region. Related fabrication methods are also described.

24 Claims, 26 Drawing Sheets

(56) References Cited

U.S. PATENT DOCUMENTS

| | | | |
|---|---|---|---|
| 2010/0252862 A1* | 10/2010 | Ko | H01L 29/1054 257/192 |
| 2011/0147813 A1 | 6/2011 | Sasaki et al. | |
| 2012/0034750 A1 | 2/2012 | Sasaki et al. | |
| 2012/0052664 A1 | 3/2012 | Fuse et al. | |
| 2012/0146148 A1* | 6/2012 | Iwamatsu | 257/351 |
| 2013/0200470 A1* | 8/2013 | Liu et al. | 257/408 |
| 2014/0159124 A1* | 6/2014 | Doris et al. | 257/288 |

FOREIGN PATENT DOCUMENTS

| | | |
|---|---|---|
| JP | 2011-129678 A | 6/2011 |
| KR | 10-0833595 B1 | 5/2008 |
| KR | 10-2009-0022631 A | 3/2009 |

* cited by examiner

SEMICONDUCTOR DEVICES INCLUDING GATE PATTERN, MULTI-CHANNEL ACTIVE PATTERN AND DIFFUSION LAYER

CROSS-REFERENCE TO RELATED APPLICATION

This application claims priority from Korean Patent Application No. 10-2013-0012494 filed on Feb. 4, 2013 in the Korean Intellectual Property Office, and all the benefits accruing therefrom under 35 U.S.C. 119, the contents of which in its entirety are herein incorporated by reference.

FIELD

The present inventive concepts relate to semiconductor devices and methods for fabricating the same.

BACKGROUND

As one of scaling technologies for increasing the density of a semiconductor device, a multi-gate transistor has been proposed, in which a fin-shaped silicon body is formed on and protrudes from a substrate and a gate is formed on the silicon body.

Since a three-dimensional channel is used in the multi-gate transistor, scaling can be achieved. In addition, current control capacity can be improved without increasing a gate length of the multi-gate transistor. In addition, a short channel effect (SCE), in which the electric potential of the channel region is affected by the drain voltage, can be effectively reduced or suppressed.

SUMMARY

The present inventive concepts provide semiconductor devices, which can provide a short channel characteristic by reducing a gate length and can obtain a high current driving capacity by reducing parasitic series resistance.

The present inventive concepts also provide methods for fabricating the semiconductor devices.

These and other objects of the present inventive concepts will be described in or be apparent from the following description of various embodiments of the inventive concepts.

According to an aspect of the present inventive concepts, there is provided a semiconductor device includes a gate pattern on a substrate, a multi-channel active pattern under the gate pattern to cross the gate pattern and having a first region not overlapping the gate pattern and a second region overlapping the gate pattern, a diffusion layer in the multi-channel active pattern along the outer periphery of the first region and including an impurity having a concentration, and a liner on the multi-channel active pattern, the liner extending on lateral surfaces of the first region and not extending on a top surface of the first region.

According to another aspect of the present inventive concepts, there is provided a semiconductor device including a gate pattern on a substrate, a multi-channel active pattern under the gate pattern to cross the gate pattern and having first and second regions not overlapping the gate pattern and a third region overlapping the gate pattern, the second region being interposed between the first region and the third region, a diffusion layer extending along the first region and the second region, the diffusion layer having a uniform width along the outer periphery of multi-channel active pattern, a liner extending on lateral surfaces of the first region and not extending on a top surface of the first region, and a source/drain in contact with the first region at the opposite side of the third region.

According to yet other aspects of the present inventive concepts, there is provided a semiconductor device including a gate pattern on a substrate, a multi-channel active pattern under the gate pattern to cross the gate pattern and having a first region not overlapping the gate pattern and a second region overlapping the gate pattern, a diffusion layer extending along the first region and the second region, the diffusion layer having a uniform width along the outer periphery of multi-channel active pattern, and a source/drain in contact with the first region at the opposite side of the second region.

According to still another aspect of the present inventive concepts, there is provided a method for fabricating a semiconductor device, the method including forming a multi-channel active pattern protruding from an isolation layer, forming a dummy gate pattern on the multi-channel active pattern, the dummy gate pattern overlapping a portion of the multi-channel active pattern, forming a pre-liner layer on a top surface of the multi-channel active pattern not overlapping the dummy gate pattern, forming an impurity supply layer on the multi-channel active pattern not overlapping the dummy gate pattern, forming a first diffusion layer in the multi-channel active pattern not overlapping the dummy gate pattern by performing a first thermal process on the impurity supply layer at a first temperature, and forming a second diffusion layer in the multi-channel active pattern along the outer periphery of the multi-channel active pattern not overlapping the dummy gate pattern by performing a second thermal process on the impurity supply layer at a second temperature.

BRIEF DESCRIPTION OF THE DRAWINGS

The above and other features and advantages of the present inventive concepts will become more apparent by describing in detail preferred embodiments thereof with reference to the attached drawings in which.

DETAILED DESCRIPTION OF THE EMBODIMENTS

Figure 1:
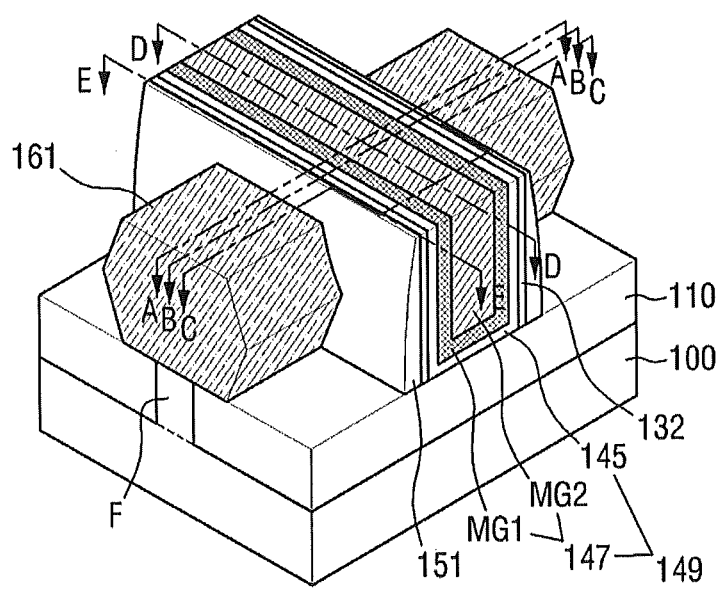
FIG. 1 is a perspective view of a semiconductor device according to an embodiment of the present inventive concepts.
Figure 1:
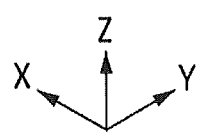

The present inventive concepts will now be described more fully hereinafter with reference to the accompanying drawings, in which various embodiments of the inventive concepts are shown. These inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity, unless otherwise stated herein.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or exemplary terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Figure 2:
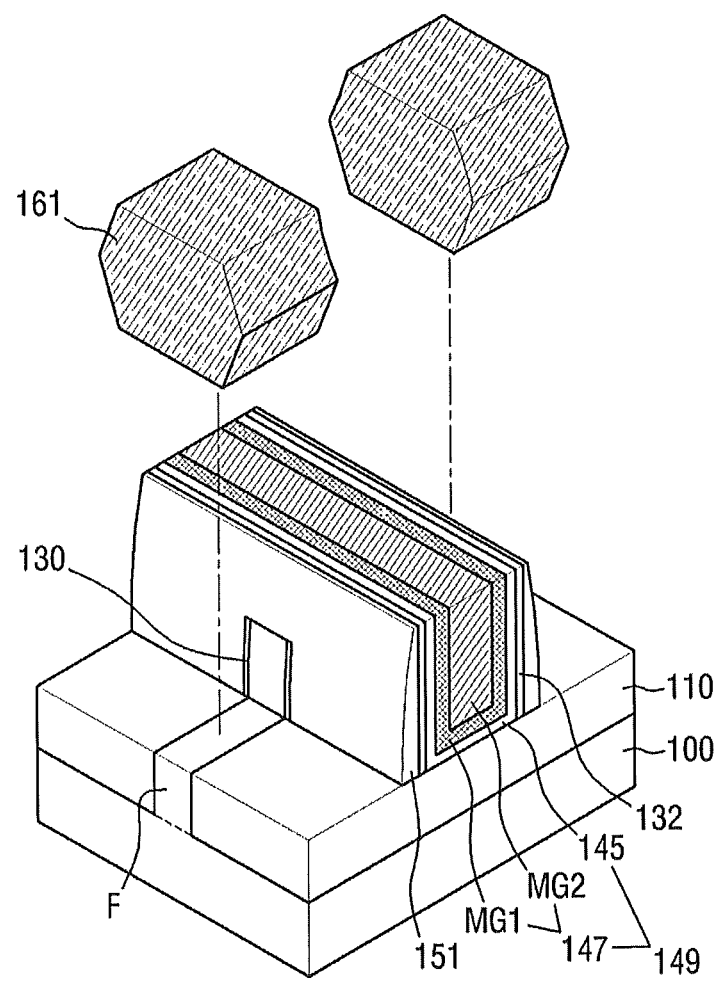
FIG. 2 is a cut-away perspective view illustrating a source/drain in the semiconductor device shown in FIG. 1.
Figure 3:
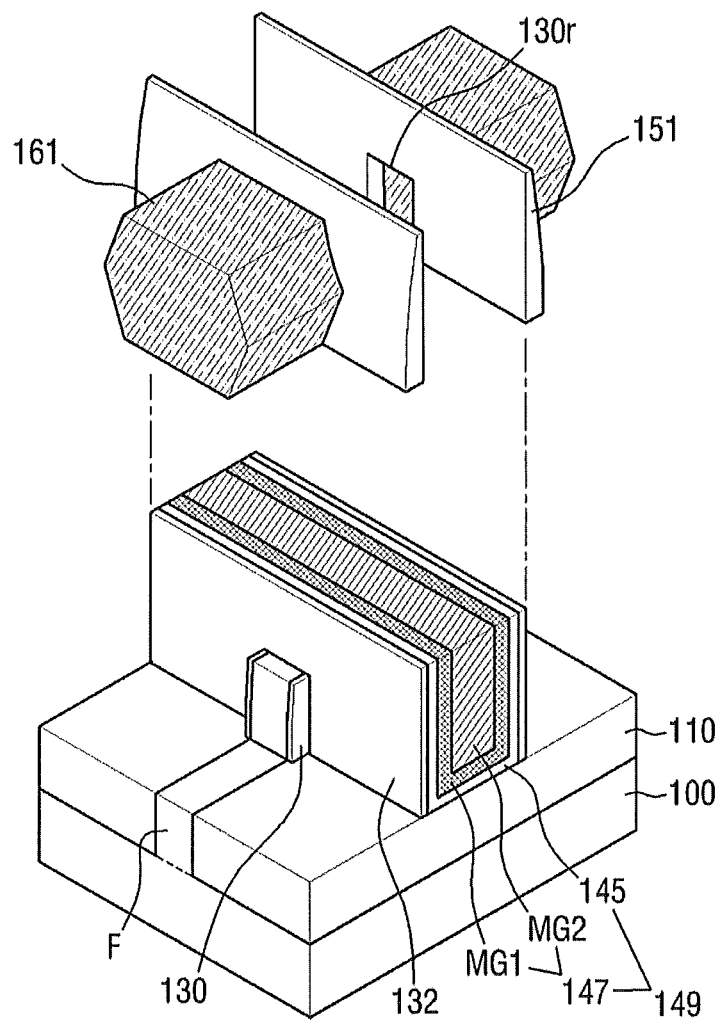
FIG. 3 is a cut-away perspective view illustrating a source/drain and a spacer in the semiconductor device shown in FIG. 1.
Figure 4:
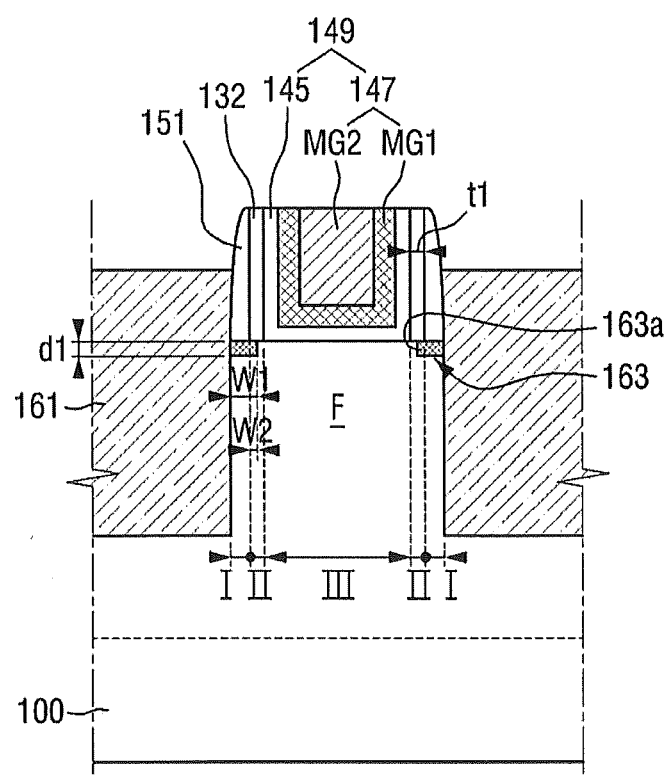
FIG. 4 is a cross-sectional view taken along the line A-A of FIG. 1.
Figure 5:
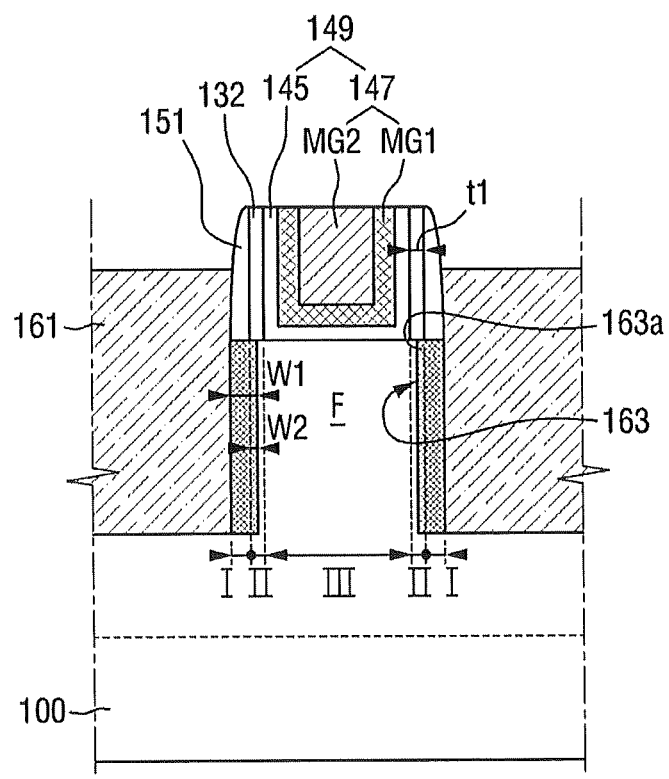
FIG. 5 is a cross-sectional view taken along the line B-B of FIG. 1.
Figure 6:
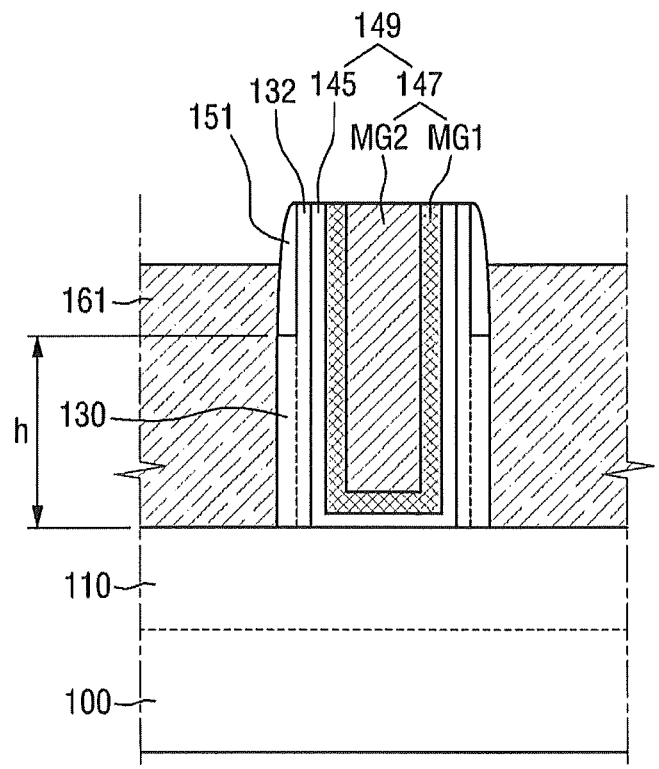
FIG. 6 is a cross-sectional view taken along the line C-C of FIG. 1.
Figure 7:
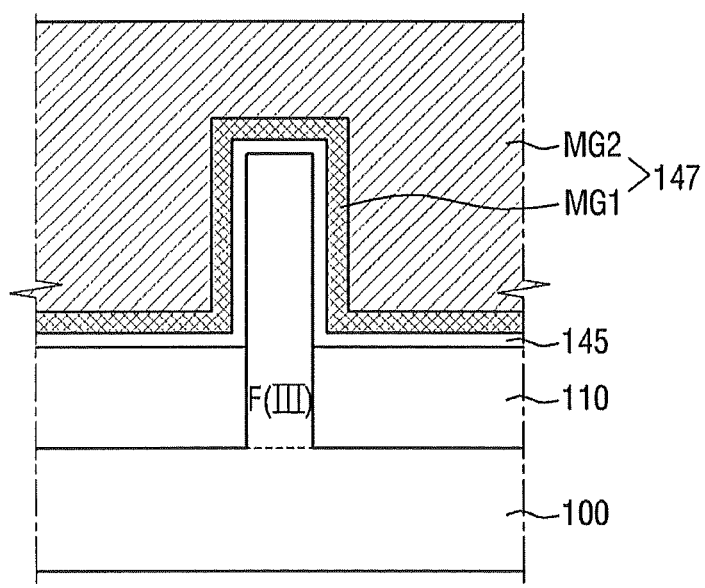
FIG. 7 is a cross-sectional view taken along the line D-D of FIG. 1.
Figure 8:
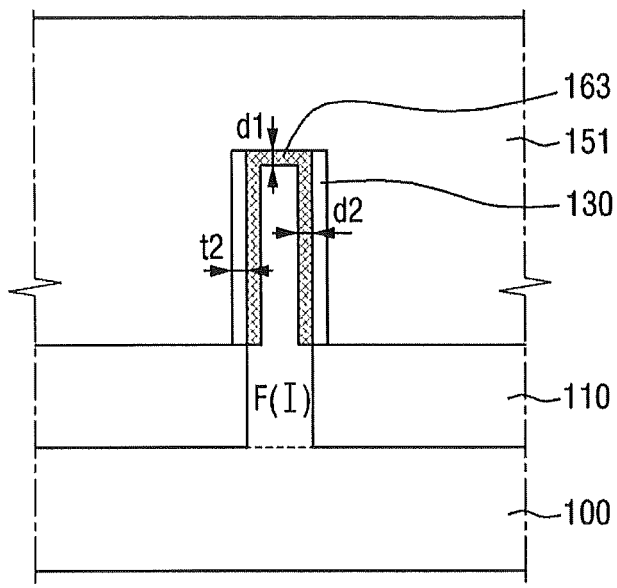
FIG. 8 is a cross-sectional view taken along the line E-E of FIG. 1.

Hereinafter, a semiconductor device according to an embodiment of the present inventive concept will be described with reference to FIGS. 1 to 8. FIG. 1 is a perspective view of a semiconductor device according to an embodiment of the present inventive concept, FIG. 2 is a cut-away perspective view illustrating a source/drain in the semiconductor device shown in FIG. 1, FIG. 3 is a cut-away perspective view illustrating a source/drain and a spacer in the semiconductor device shown in FIG. 1, FIG. 4 is a cross-sectional view taken along the line A-A of FIG. 1, FIG. 5 is a cross-sectional view taken along the line B-B of FIG. 1, FIG. 6 is a cross-sectional view taken along the line C-C of FIG. 1, FIG. 7 is a cross-sectional view taken along the line D-D of FIG. 1, and FIG. 8 is a cross-sectional view taken along the line E-E of FIG. 1.

FIG. 1 shows a gate pattern 149 and a source/drain 161, excluding an interlayer dielectric film formed on an isolation layer 110.

Referring to FIG. 1, a semiconductor device 10 includes a multi-channel active pattern F, a gate pattern 149, a source/drain 161 and a first liner 132.

The multi-channel active pattern F may be, for example, a fin or nano wire. In the semiconductor device according to an embodiment of the present inventive concepts, the multi-channel active pattern F will be described with regard to a fin-shaped pattern. Therefore, in describing the embodiment of the present inventive concepts, the semiconductor device 10 will be described with regard to a fin-type transistor.

The multi-channel active pattern F may be formed to extend in a second direction (Y). The multi-channel active pattern F may be a portion of the substrate 100 and may include an epitaxial layer grown from the substrate 100. The active pattern F protrudes form the substrate 100. The isolation layer 110 may cover lateral surfaces of the multi-channel active pattern F.

The gate pattern 149 is formed on the substrate 100 and may cross the multi-channel active pattern F. For example, the gate pattern 149 may extend in a first direction (X). The gate pattern 149 may include a gate electrode 147 and a gate insulation layer 145.

The gate electrode 147 may include metal gate layers MG1 and MG2. As shown in FIG. 1, the gate electrode 147 may have two or more metal gate layers MG1 and, MG2 stacked. The first metal gate layer MG1 serves to adjust a work function, and the second metal gate layer MG2 serves to fill a space formed by first metal gate layer MG1. For example, the first metal gate layer MG1 may include TiN, TaN, TiC, and/or TaC, and the second metal gate layer MG2 may include W and/or Al. The gate electrode 147 may include a non-metal material, such as Si, SiGe, etc. The gate electrode 147 may be formed by, for example, a replacement process, but aspects of the present inventive concept are not limited thereto.

The gate insulation layer 145 may be formed between the multi-channel active pattern F and the gate electrode 147. As will further be described with reference to FIG. 7, the gate insulation layer 145 may be formed on a top surface of and top portions of lateral surfaces of the multi-channel active pattern F. In addition, the gate insulation layer 145 may be positioned between the gate electrode 147 and the isolation layer 110. The gate insulation layer 145 may include a high-k dielectric material having a higher dielectric constant than a silicon oxide layer. For example, the gate insulation layer 145 may include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate, but aspects of the present inventive concepts are not limited thereto.

The source/drain 161 is formed at opposite sides of the gate pattern 149. The source/drain 161 is formed on the multi-channel active pattern F exposed by the isolation layer 110. The source/drain 161 may be an elevated source/drain. That is to say, a top surface of the source/drain 161 may be higher than that of the isolation layer 110. In addition, the source/drain 161 and the gate pattern 149 may be insulated by the spacer 151 and the first liner 132.

FIG. 1 shows that the source/drain 161 is hexagonal, but aspects of the present inventive concepts are not limited thereto. That is to say, the source/drain 161 may be shaped of, for example, a diamond, a circle, a tetragon, a pentagon or any other polygonal or ellipsoidal shape.

If the semiconductor device 10 is a PMOS fin type transistor, the source/drain 161 may include a compressive stress material. For example, the compressive stress material may have a larger lattice constant than silicon (Si), e.g., SiGe. The compressive stress material may improve carrier mobility of a channel region by applying a compressive stress to the multi-channel active pattern F.

By contrast, if the semiconductor device 10 is an NMOS fin type transistor, the first source/drain 161 may include the same material as the substrate 100, or a tensile stress material. For example, when the substrate 100 includes Si, the source/drain 161 may include Si, or a material having a smaller lattice constant than Si (e.g., SiC).

The first liner 132 may be formed at both lateral surfaces of the gate pattern 149. The first liner 132 may include, for example, silicon nitride, silicon oxide, low-k silicon nitride, and/or low-k silicon oxide. While the first liner 132 is a single layer in the illustrated embodiment, it may be formed of multiple layers. The first liner 132 may include, for example, impurities, which will later be described in detail when the fabricating method of the semiconductor device is described.

The spacer 151 may be formed on lateral surfaces of the first liner 132. That is to say, the first liner 132 and the spacer 151 may be sequentially formed on both lateral surfaces of the gate pattern 149. The spacer 151 may include nitride and/or oxynitride.

The substrate 100 may include, for example, a bulk silicon substrate or a silicon on insulator (SOI) substrate. Alternatively, the substrate 100 may be a silicon substrate or a substrate made of another material such as germanium, indium antimonide, lead telluride, indium arsenide, indium phosphide, gallium arsenide, and/or gallium antimonide. In addition, the substrate 100 may be an epitaxial layer formed on a base substrate.

Referring to FIGS. 2 and 3, the semiconductor device 10 may further include a second liner 130.

The second liner 130 may be formed on portions of the lateral surfaces of the multi-channel active pattern F, while not being formed on the top surface of the multi-channel active pattern F. The second liner 130 is exposed by the spacer 151 but does not protrude from the spacer 151. The second liner 130 may include, for example, silicon nitride, silicon oxide, low-k silicon nitride, and/or low-k silicon oxide. The second liner 130 may be formed of the same material as the first liner 132. While the second liner 130 is a single layer in the illustrated embodiment, it may be formed of multiple layers. The second liner 130 may include, for example, the same impurities included in the first liner 132.

The first liner 132 may be shaped of a plate formed on a plane formed by a first direction (X) and a third direction (Z). The second liner 130 may be formed on portions of the lateral surfaces of the multi-channel active pattern F and may protrude in a second direction (Y) from the first liner 132. The first liner 132 and the second liner 130 may be formed at the same level and may be physically connected to each other. As used herein, the term "the same level" means that the first liner 132 and the second liner 130 may be formed by the same fabrication process. The second liner 130 may be spaced apart from the gate pattern 149 by a width of the first liner 132.

FIG. 4 is a cross-sectional view illustrating a central portion of the multi-channel active pattern F shown in FIG. 1, FIG. 5 is a cross-sectional view illustrating the multi-channel active pattern F and the isolation layer 110 shown in FIG. 1, FIG. 6 is a cross-sectional view illustrating the second liner 130 and the gate pattern 149 not overlapping the multi-channel active pattern F shown in FIG. 2, FIG. 7 is a cross-sectional view illustrating a central portion of the gate pattern 149 shown in FIG. 1, and FIG. 8 is a cross-sectional view illustrating a portion of the spacer 151 shown in FIG. 1.

Referring to FIGS. 3, 4 and 8, the multi-channel active pattern F protruding on the isolation layer 110 extends in the second direction (Y). A portion of the multi-channel active pattern F where the source/drain 161 is formed is coplanar with the isolation layer 110. The gate pattern 149 is formed on the substrate 100 across the multi-channel active pattern F.

In detail, the multi-channel active pattern F protruding on the isolation layer 110 is formed under the gate pattern 149 and across the gate pattern 149. The multi-channel active pattern F includes a third region F(III) overlapping the gate pattern 149 and a first region F(I) and a second region F(II) not overlapping the gate pattern 149. The second region F(II) is interposed between the first region F(I) and the third region F(III). In FIG. 3, the multi-channel active pattern F protruding from the gate pattern 149 and the first liner 132 is the first region F(I) of the multi-channel active pattern.

A diffusion layer 163 is formed in the multi-channel active pattern F along the outer periphery of the first region F(I). The diffusion layer 163 includes a first impurity having a first concentration. As used herein, the term "outer periphery" means a boundary portion between one layer and another layer. That is to say, referring to FIG. 3, the outer periphery of the first region F(I) of the multi-channel active pattern F is a portion formed by connecting the lateral surfaces of the multi-channel active pattern F bordering the second liner 130 with the top surface of the multi-channel active pattern F bordering the spacer 151.

The diffusion layer 163 formed along the outer periphery of the first region F(I) of the multi-channel active pattern F is continuously formed along the lateral and top surfaces of the first region F(I). The diffusion layer 163 may be formed to a first depth d1 on the top surface of the first region F(I) of the multi-channel active pattern F and may be formed to a second depth d2 on the lateral surfaces of the first region F(I) of the multi-channel active pattern F. The diffusion layer 163 formed on the lateral surfaces of the first region F(I) and the diffusion layer 163 formed on the top surface of the first region F(I) may be formed to substantially the same depth.

The first depth d1 may be substantially the same as the second depth d2. That is to say, the diffusion layer 163 formed along the outer periphery of the first region F(I) of the multi-channel active pattern F may be formed to a uniform depth in the multi-channel active pattern F. It will be understood that a boundary of the diffusion layer 163 that defines a width, depth and/or other size of the diffusion layer 163 may itself be delineated by an outer surface of the diffusion layer that has a given impurity concentration.

The first impurity included in the diffusion layer 163 may include, for example, arsenic (As), phosphorus (P), boron (B) and/or carbon (C). In the following description, the embodiments of the present inventive concepts will be described with regard to a case where the first impurity is arsenic (As).

The diffusion layer 163 may be formed along the first region F(I) and the second region F(II). For example, the diffusion layer 163 may be formed along the first region F(I) and at least a portion of the second region F(II). The diffusion layer 163 may be formed in the multi-channel active pattern F along the outer periphery of the multi-channel active pattern F. The diffusion layer 163 may include a diffusion layer extension part 163a extending in the second region F(II). The diffusion layer 163 may be, for example, a lightly doped region.

In the multi-channel active pattern F, w1 refers to a first width of the diffusion layer 163, and w2 refers to a second width of the diffusion layer extension part 163a. That is to say, the second region F(II) of the multi-channel active pattern F overlaps the diffusion layer 163 by the second width w2.

In the illustrated embodiment of the present inventive concepts, the diffusion layer 163 is formed along the first region F(I) and at least a portion of the second region F(II), but aspects of the present inventive concepts are not limited thereto. That is to say, a portion of the diffusion layer 163 may overlap the gate pattern 149, irrespective of an overlapping width of the diffusion layer 163 and the second region F(II).

The source/drain 161 is formed in contact with the first region F(I) of the multi-channel active pattern F from the opposite side of the second region F(II). The source/drain 161 may include a second impurity having a second concentration. The second concentration of the second impurity included in the source/drain 161 may be different from the first concentration of the first impurity in the diffusion layer 163. In the semiconductor device according to the embodiment of the present inventive concepts, the second concentration of the second impurity may be higher than the first concentration of the first impurity. The source/drain 161 may be, for example, a highly doped region.

The diffusion layer 163 may relieve a highly concentrated electric field between the highly doped source/drain 161 and the first region F(I) of the multi-channel active pattern F.

The second impurity included in the source/drain 161 and the first impurity included in the diffusion layer 163 may be the same with each other, but aspects of the present inventive concepts are not limited thereto.

The second liner 130 may be formed on the multi-channel active pattern F, specifically, on a portion of the multi-channel active pattern F. The second liner 130 is formed on the lateral surfaces of the first region F(I) of the multi-channel active pattern F and is not formed on the top surface of the first region F(I) of the multi-channel active pattern F. That is to say, as shown in FIG. 3, the second liner 130 is formed on lateral surfaces of the first region F(I) of the multi-channel active pattern F protruding from the gate pattern 149 and the first liner 132, but is not formed on the top surface of the first region F(I) of the multi-channel active pattern F. In FIG. 4, the first liner 132 is not formed on the top surface of the first region F(I) of the multi-channel active pattern F, while the spacer 151 is formed on the top surface of the first region F(I) of the multi-channel active pattern F.

The second liner 130 may be formed in contact with the first region F(I) of the multi-channel active pattern F.

A second thickness t2 of the second liner 130 formed on the lateral surfaces of the first region F(I) of the multi-channel active pattern F may be uniform along first region F(I). That is to say, the second liner 130 may be formed on the lateral surfaces of the first region F(I) to a uniform thickness first region F(I).

The second liner 130 formed on the first region F(I) may entirely overlap the diffusion layer 163. The second liner 130 may have a width obtained by subtracting a width of the diffusion layer extension part 163a from a width of the diffusion layer 163, i.e., w1-w2.

The first liner 132 may be formed on the of the second region F(II) of the multi-channel active pattern along the outside of the second region F(II) interposed between the first region F(I) and the third region F(III). The first liner 132 overlaps the second region F(II). At the same time, the first liner 132 may be formed along the lateral surfaces of the gate pattern 149. In detail, the first liner 132 may be formed in contact with the lateral surfaces of the gate pattern 149. The first liner 132 formed along the lateral surfaces of the gate pattern 149 may be formed to a uniform thickness, that is, the first thickness t1.

The first thickness t1 of the first liner 132 may be substantially the same as the width of the second region F(II) of the multi-channel active pattern F. In addition, since the first liner 132 and the second liner 130 are formed at the same level, the first thickness t1 of the first liner 132 and the second thickness t2 of the second liner 130 may be substantially the same with each other. As described above, the first liner 132 is connected to the second liner 130.

The first liner 132 may overlap a portion of the diffusion layer 163 formed in the multi-channel active pattern F. An overlapping width of the diffusion layer 163 and the first liner 132 may be w2, that is, the width of the diffusion layer extension part 163a.

In the semiconductor device according to the embodiment of the present inventive concepts, when the first impurity included in the diffusion layer 163 is arsenic (As), arsenic (As) may be included throughout the entire layers of the first liner 132 and the second liner 130.

The spacer 151 is formed on the second liner 130 and the first region F(I) of the multi-channel active pattern F. Whereas the second liner 130 is interposed between the lateral surfaces of the multi-channel active pattern F and the spacer 151, it is not interposed between the top surface of the multi-channel active pattern F and the spacer 151. That is to say, the spacer 151 may be formed in contact with the top surface of the multi-channel active pattern F. The spacer 151 may also be formed on the lateral surfaces of the first liner 132. The spacer 151 may be formed in contact with the top surface of the first region F(I) of the multi-channel active pattern F and the second liner 130.

Referring to FIG. 4, the source/drain 161 is formed on both lateral surfaces of the multi-channel active pattern F. The gate pattern 149, the first liner 132 and the spacer 151 are formed on the top surface of the multi-channel active pattern F. The first liner 132 and the spacer 151 are sequentially formed on both lateral surfaces of the gate pattern 149.

Referring to FIGS. 1 and 5, the diffusion layer 163 formed in the multi-channel active pattern F is formed to a uniform thickness w1 along the periphery of the multi-channel active pattern F. The diffusion layer 163 has the width w1 in the second direction (Y). The width of the diffusion layer 163 formed in the first region F(I) of the multi-channel active pattern F is w1-w2. The diffusion layer 163 formed in the first region F(I) of the multi-channel active pattern F has the width w2. Therefore, the diffusion layer extension part 163a is formed to a uniform thickness w2 in the second region F(II) of the multi-channel active pattern F along the outer periphery of the multi-channel active pattern F.

As the result, the diffusion layer 163 formed in the multi-channel active pattern F along the outer periphery of the multi-channel active pattern F may overlap the first liner 132 and the gate pattern 149 with the uniform thickness width w2. Since the diffusion layer 163 is formed between the source/drain 161 and a third region F(III) used as a channel of the semiconductor device to a uniform thickness w1, the semiconductor device can obtain a high current driving capacity and short channel characteristics.

Referring to FIG. 6, the gate pattern 149 is formed on one lateral surface of the first liner 132, and the second liner 130 and the spacer 151 are formed on the other lateral surface of the first liner 132. The first liner 132 and the second liner 130 form an L-shaped structure, and the spacer 151 is formed in contact with the first liner 132 and the second liner 130. A height h of the second liner 130 is equal to a height of the multi-channel active pattern F protruding on the isolation layer 110.

Referring to FIG. 7, the isolation layer 110 is formed under the multi-channel active pattern F on the substrate 100. The gate insulation layer 145 is formed on the multi-channel active pattern F protruding on the isolation layer 110, and the gate electrode 147 including the first metal gate layer MG1 and the second metal gate layer MG2 is formed on the gate insulation layer 145.

In FIG. 7, the first liner 132 and the second liner 130 are not formed on the multi-channel active pattern F overlapping the gate insulation layer 145.

Referring to FIG. 8, the diffusion layer 163 having uniform thicknesses d1 and d2 is formed in the first region F(I) of the multi-channel active pattern F. The second liner 130 having the second thickness t2 is formed on the lateral surfaces of the first region F(I) of the multi-channel active pattern F. The spacer 151 is entirely formed around the first region F(I) of the multi-channel active pattern F where the second liner 130 is formed only on its lateral surfaces.

Next, a method for fabricating a semiconductor device according to an embodiment of the present inventive concepts will be described with reference to FIGS. 1 and 9 to 20.

FIGS. 9 to 20 illustrate intermediate process steps for explaining a method for fabricating a semiconductor device according to an embodiment of the present inventive concepts. Specifically, FIGS. 13B, 14B and 15B are cross-sectional views taken along the line G-G of FIGS. 13A, 14A and 15A, respectively, and FIGS. 13C, 14C and 15C are cross-sectional views taken along the line H-H of FIGS. 13A, 14A and 15A, respectively.

Figure 9:
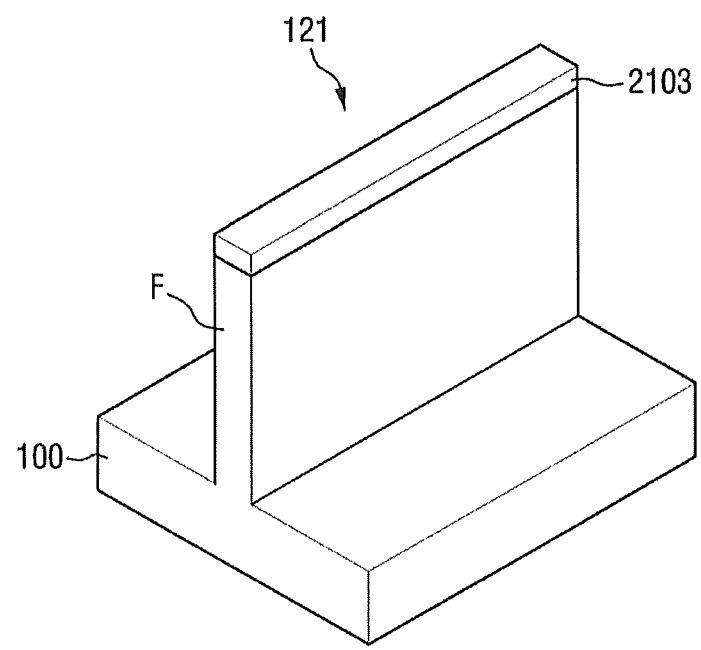
FIGS. 9 to 20 illustrate intermediate process steps for explaining a method for fabricating a semiconductor device according to an embodiment of the present inventive concepts.
Figure 9:
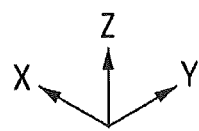

Referring to FIG. 9, a multi-channel active pattern F is formed on the substrate 100.

In detail, a mask pattern 2103 is formed on a substrate 100, followed by etching, thereby forming the multi-channel active pattern F. The multi-channel active pattern F may extend in a second direction (Y). A trench 121 is formed in the vicinity of the multi-channel active pattern F. The mask pattern 2103 may include silicon oxide, silicon nitride and/or silicon oxynitride.

Figure 10:
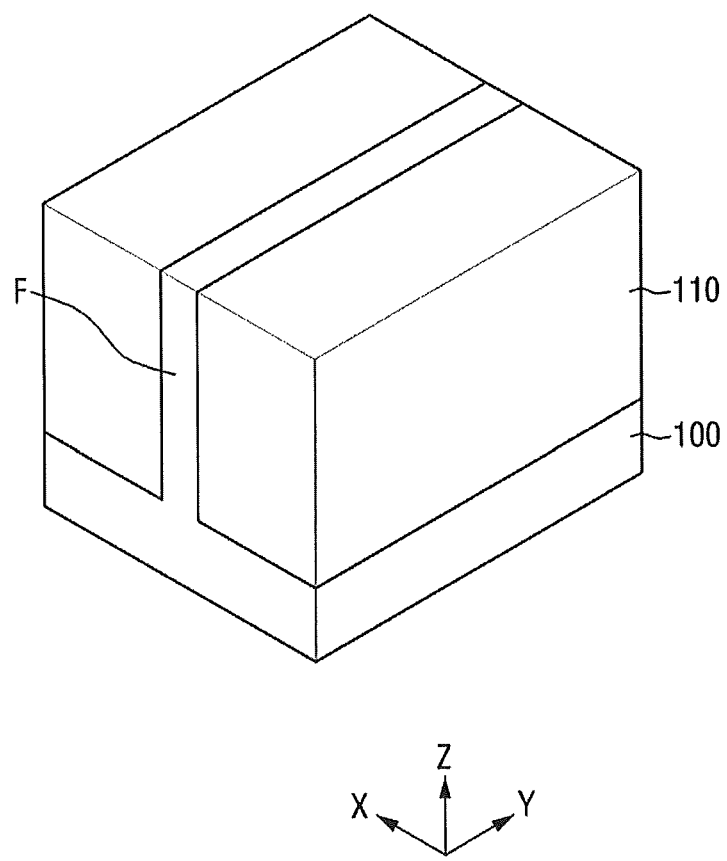

Referring to FIG. 10, an isolation layer 110 filling the trench 121 is formed. The isolation layer 110 may include silicon oxide, silicon nitride and/or silicon oxynitride.

The multi-channel active pattern F and the isolation layer 110 may be positioned on the same plane through a planarization process. The mask pattern 2103 may be removed by performing the planarization process, but aspects of the present inventive concepts are not limited thereto. That is to say, the mask pattern 2103 may be removed before the isolation layer 110 is formed or after a recess process is performed, which will later be described with reference to FIG. 11.

Figure 11:
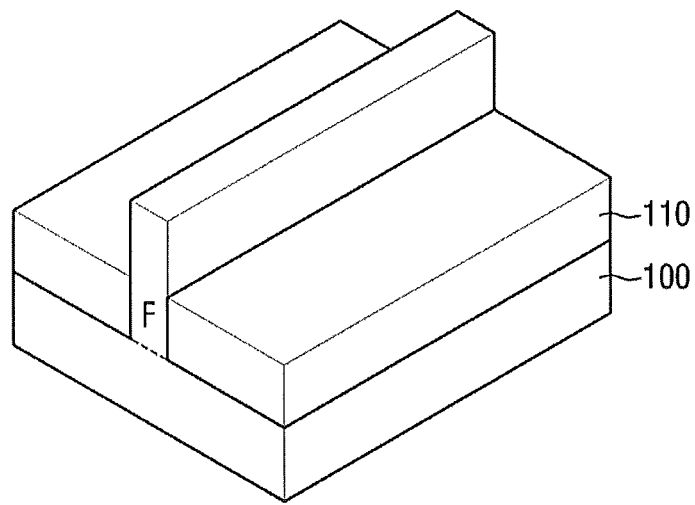

Referring to FIG. 11, a top portion of the isolation layer 110 is recessed to expose a top portion of the multi-channel active pattern F. The recess process may include a selective etching process. That is to say, the multi-channel active pattern F protruding on the isolation layer 110 is formed.

Meanwhile, a portion of the multi-channel active pattern F protruding on the isolation layer 110 may be formed by an epitaxial process. In detail, after forming the isolation layer 110, the portion of the multi-channel active pattern F protruding on the isolation layer 110 may be formed by the epitaxial process using as a seed the top surface of the multi-channel active pattern F exposed by the isolation layer 110 without performing the recess process.

In addition, a doping process for adjusting a threshold voltage may be performed on the multi-channel active pattern F. If the semiconductor device 10 is an NMOS fin type transistor, the impurity may be boron (B). If the semiconductor device 10 is a PMOS fin type transistor, the impurity may be phosphorus (P) or arsenic (As).

Figure 12:
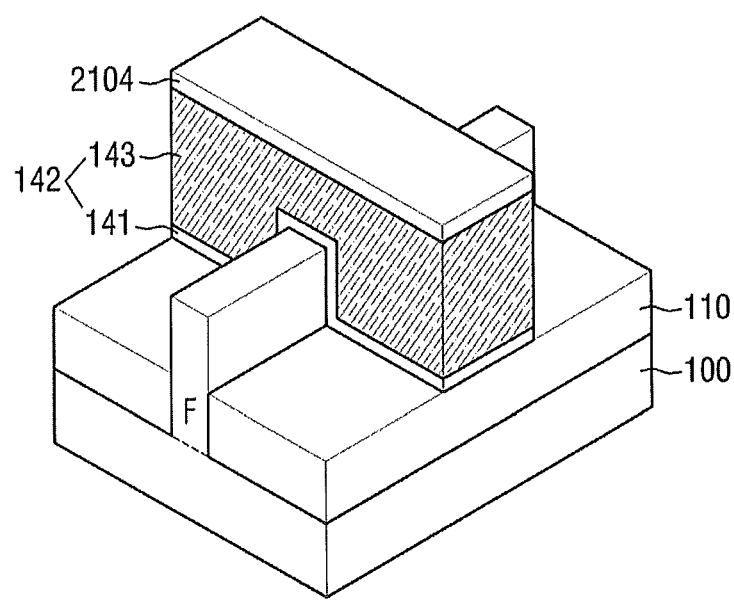

Referring to FIG. 12, an etching process is performed using a mask pattern 2104 to form a dummy gate pattern 142 extending in a first direction (X) across the multi-channel active pattern F.

As the result, the dummy gate pattern 142 is formed on the multi-channel active pattern F. The dummy gate pattern 142 may overlap a portion of the multi-channel active pattern F. The multi-channel active pattern F may include a portion covered by the dummy gate pattern 142 and a portion exposed by the dummy gate pattern 142.

The dummy gate pattern 142 may include a dummy gate insulation layer 141 and a dummy gate electrode 143. For example, the dummy gate insulation layer 141 may include silicon oxide, and the dummy gate electrode 143 may include polysilicon.

Figure 13A:
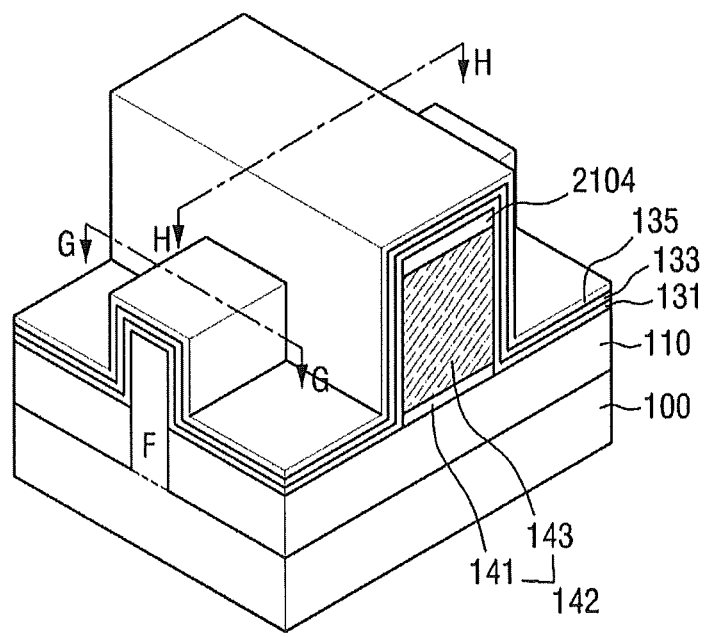
Figure 13B:
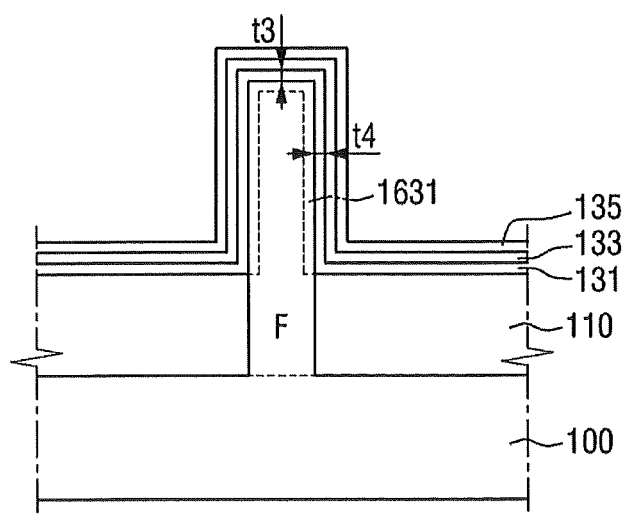
Figure 13C:
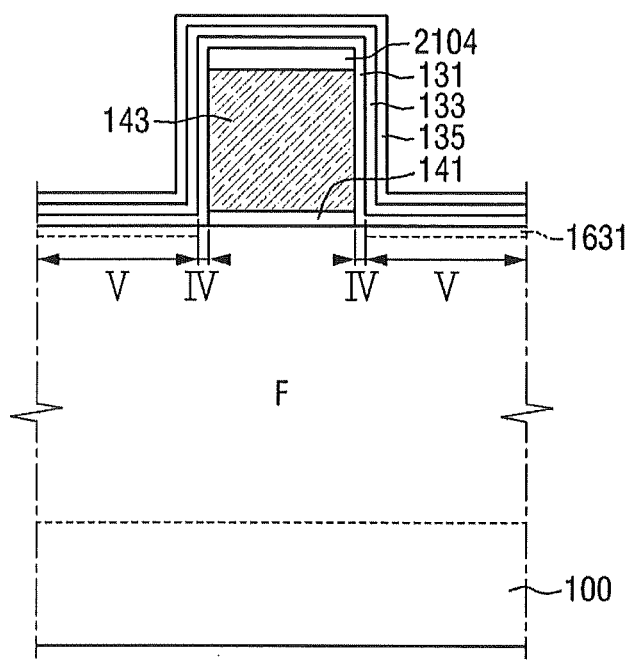

Referring to FIGS. 13A to 13C, a pre-liner layer 131 and an impurity supply layer 133 are sequentially formed on top surfaces of multi-channel active patterns F(IV) and F(V) not overlapping the dummy gate pattern 142. The pre-liner layer 131 and the impurity supply layer 133 may also be formed on lateral surfaces of the multi-channel active patterns F(IV) and F(V) not overlapping the dummy gate pattern 142. In addition, the pre-liner layer 131 and the impurity supply layer 133 may be formed on the lateral surfaces of the dummy gate pattern 142.

The pre-liner layer 131 may be formed to a uniform thickness on the top and lateral surfaces of the multi-channel active patterns F(IV) and F(V) not overlapping the dummy gate pattern 142. In other words, when the pre-liner layer 131 formed on the top surface of the multi-channel active patterns F(IV) and F(V) not overlapping the dummy gate pattern 142 has a third thickness t3, and the pre-liner layer 131 formed on the lateral surfaces of the multi-channel active patterns F(IV) and F(V) not overlapping the dummy gate pattern 142 has a fourth thickness t4, the third thickness t3 of the pre-liner layer 131 and the fourth thickness t4 of the pre-liner layer 131 may be substantially the same with each other.

A byproduct layer 135 may further be formed on the lateral surfaces of the dummy gate pattern 142 and on the impurity supply layer 133 formed on the multi-channel active patterns F(IV) and F(V) not overlapping the dummy gate pattern 142. In the fabricating method of the semiconductor device according to the embodiment of the present inventive concepts, the byproduct layer 135 is further formed on the impurity supply layer 133, but aspects of the present inventive concepts are not limited thereto.

In detail, the pre-liner layer 131 is formed on the dummy gate pattern 142 and the multi-channel active pattern F. That is to say, the pre-liner layer 131 is formed on the multi-channel active patterns F(IV) and F(V) not overlapping the dummy gate pattern 142 and on the lateral surfaces of the dummy gate pattern 142. A portion F(IV) of the multi-channel active pattern not overlapping the dummy gate pattern 142 may overlap the pre-liner layer 131 formed on the lateral surfaces of the dummy gate pattern 142. The pre-liner layer 131 may be conformally formed on the dummy gate pattern 142 and the multi-channel active pattern F. The pre-liner layer 131 formed on the top surface of the multi-channel active pattern F and the pre-liner layer 131 formed on the lateral surfaces of the multi-channel active pattern F may be formed to substantially the same thickness. The pre-liner layer 131 may include, for example, silicon nitride and/or silicon oxide. The pre-liner layer 131 may be formed by, for example, atomic layer deposition (ALD).

After forming the pre-liner layer 131, a pre-amorphization implantation (PAI) process may be performed. As the result of the PAI process, an outer peripheral portion of the multi-channel active pattern F(V) not overlapping the dummy gate pattern 142 may be amorphized.

After performing the PAI process, the impurity supply layer 133 including a first impurity is formed on the multi-channel active pattern F not overlapping the dummy gate pattern 142. That is to say, the impurity supply layer 133 is formed on the pre-liner layer 131.

In the fabricating method of the semiconductor device according to the embodiment of the present inventive concepts, the first impurity included in the impurity supply layer 133 is arsenic (As), but aspects of the present inventive concepts are not limited thereto. That is to say, the first impurity included in the impurity supply layer 133 may include, for example, phosphorus (P), boron (B) and/or carbon (C).

A process of forming the impurity supply layer 133 will now be described in detail.

First, arsenic plasma is formed using an arsenic-containing precursor gas (e.g., arsenic halide or arsenic hydride) and a diluted gas. Here, the arsenic plasma includes arsenic ions and arsenic radicals. An arsenic layer may be conformally formed on the pre-liner layer 131 by the arsenic radicals included in the arsenic plasma. When the arsenic layer is formed, the arsenic ions included in the arsenic plasma penetrate the pre-liner layer 131 to then be injected into the multi-channel active pattern F. An impurity implantation layer 1631 may be formed under the pre-liner layer 131 by the injected arsenic ions. The impurity implantation layer 1631 may be formed along the outer periphery of the multi-channel active pattern F not overlapping the dummy gate pattern 142. In FIG. 13C, the impurity implantation layer 1631 is not formed on the multi-channel active pattern F(IV) overlapping the pre-liner layer 131 formed on the lateral surfaces of the dummy gate pattern 142, but aspects of the present inventive concepts are not limited thereto.

The arsenic layer may also be formed by, for example, a multi step doping process performed while varying processing pressures, biases applied to a substrate, doses, plasma source power, flow rates of precursor gas, and so on.

In forming the arsenic layer on the pre-liner layer 131, when the processing pressure rises, the thickness of the arsenic layer generally increases and the arsenic layer is conformally formed. In addition, the amount of arsenic ions injected into the multi-channel active pattern F may increase, and the impurity implantation layer 1631 formed by injecting arsenic ions may be conformally formed.

After forming the arsenic layer, the arsenic included in the arsenic layer may be injected into the multi-channel active pattern F not overlapping the dummy gate pattern 142 using a knock-in gas. That is to say, arsenic (As) may be knocked in the multi-channel active pattern F. The knock-in gas may include, for example, argon (Ar), neon (Ne), helium (He), hydrogen ($H_2$), krypton (Kr), and/or xenon (Xe). The knocking-in of arsenic (As) into the multi-channel active pattern F may be selectively performed.

After forming the arsenic layer, the arsenic layer may be passivated. The passivating of the arsenic layer is performed for the reason that follows. Since Arsenic (As) is a sublimating material, it may sublime and vanish even before it is diffused into the multi-channel active pattern F. In addition, if the arsenic layer comes into contact with the air, irregularities may be formed on a surface of the arsenic layer conformally formed on the multi-channel active pattern F. Thus, the diffusion layer may be not uniformly formed in the multi-channel active pattern F.

The passivating of the arsenic layer may be performed using oxygen plasma. That is to say, the arsenic layer formed on the pre-liner layer 131 may be passivated by oxygen contained in the oxygen plasma. In the course of passivating the arsenic layer, a portion of the arsenic layer may chemically react with the plasma gas employed in the passivating. In the embodiment of the present inventive concepts, oxygen plasma is used as the passivation plasma. Thus, oxygen and arsenic chemically react with each other, thereby forming arsenic oxide ($As_xO_y$) on the pre-liner layer 131. As the result, the impurity supply layer 133 may be formed on the pre-liner layer 131.

In the fabricating method of the semiconductor device according to the embodiment of the present inventive concepts, the impurity supply layer 133 may include arsenic and arsenic oxide. The oxygen passivation may be performed, for example, in situ.

After forming the impurity supply layer 133 by oxygen passivation, the byproduct layer 135 may be formed on the impurity supply layer 133. Even after passivating the arsenic layer using the oxygen plasma, some of arsenic ions or radicals react with external hydrogen to form the byproduct layer 135. In the fabricating method of the semiconductor device according to the embodiment of the present inventive concepts, the byproduct layer 135 may include arsenic hydride ($As_xH_y$).

As the result, the pre-liner layer 131, the impurity supply layer 133 and the byproduct layer 135 may be sequentially formed on the multi-channel active pattern F not overlapping the dummy gate pattern 142.

Figure 14A:
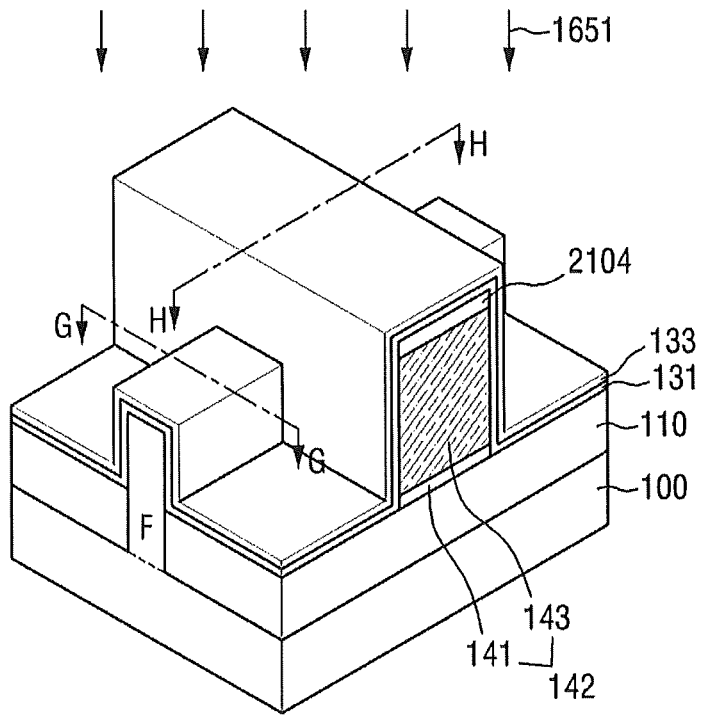
Figure 14A:
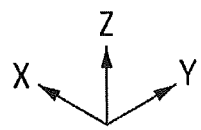
Figure 14B:
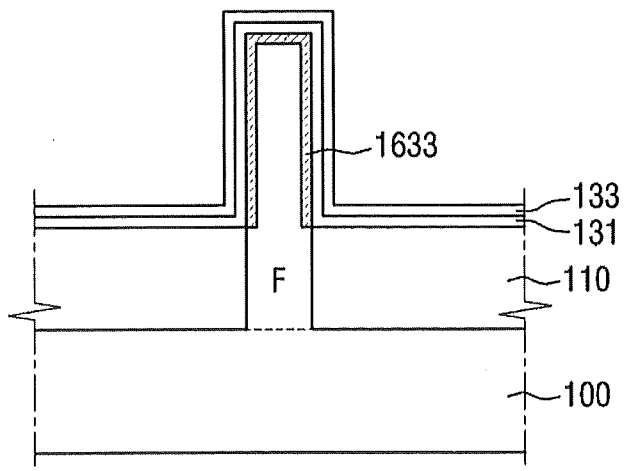
Figure 14C:
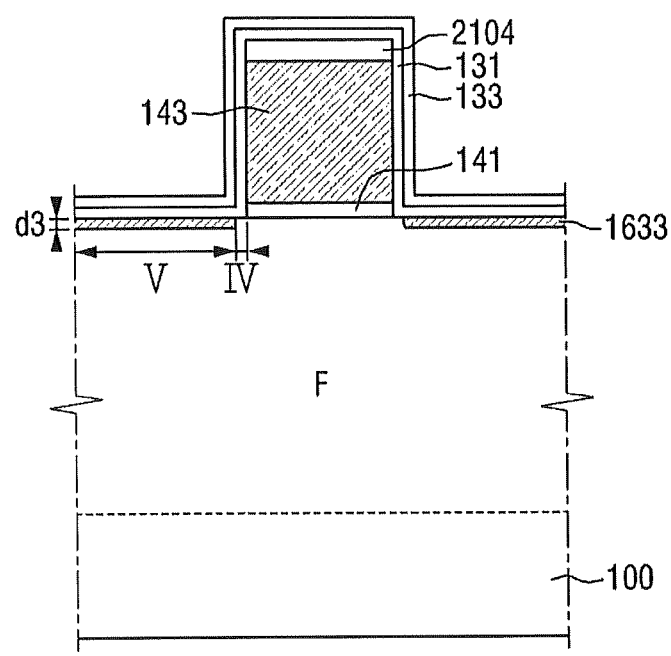

Referring to FIGS. 14A to 14C, a first thermal process 1651 is performed on the impurity supply layer 133 at a first temperature, thereby forming a pre-diffusion layer 1633 in the multi-channel active pattern F not overlapping the dummy gate pattern 142. The pre-diffusion layer 1633 may be formed when the first impurity included in the impurity supply layer 133 passes through the pre-liner layer 131 to then be diffused into the multi-channel active pattern F. That is to say, the arsenic included in the impurity supply layer 133 passes through the pre-liner layer 131 by diffusion and is then diffused into the multi-channel active pattern F, thereby forming the pre-diffusion layer 1633. The pre-diffusion layer 1633 may be formed in the multi-channel active pattern F to a third depth d3.

In detail, the first temperature of performing the first thermal process 1651 may be a temperature at which the byproduct layer 135 formed on the impurity supply layer 133 is removed and the first impurity included in the impurity supply layer 133 is easily diffused. In the fabricating method of the semiconductor device according to the embodiment of the present inventive concepts, the first temperature may be a temperature at which arsenic included in arsenic hydride ($As_xH_y$) can be sublimated while arsenic included in the impurity supply layer 133 can be diffused into the pre-liner layer 131 and the multi-channel active pattern F. In detail, the first temperature of performing the first thermal process 1651 may be 700° C. or less.

The first thermal process 1651 may be, for example, furnace annealing, rapid thermal annealing (RTA), rapid thermal oxidation (RTO), plasma annealing and/or micro-wave annealing.

As the result of the first thermal process 1651, the byproduct layer 135 formed on the impurity supply layer 133 may be removed. That is to say, arsenic included in the byproduct layer 135 is sublimated, thereby removing the byproduct layer 135.

While the byproduct layer 135 is removed through the first thermal process 1651, arsenic oxide and arsenic included in the impurity supply layer 133 are diffused into the pre-liner layer 131. In addition, the arsenic oxide and arsenic having passed through the pre-liner layer 131 are diffused into the multi-channel active pattern F.

In the fabricating method of the semiconductor device according to the embodiment of the present inventive concept, when the multi-channel active pattern F is formed of silicon, the arsenic oxide diffused into the multi-channel active pattern F may react with the multi-channel active pattern F, thereby forming SiOx:As. That is to say, the arsenic may be doped into a silicon oxide. As the arsenic oxide and arsenic are diffused into the multi-channel active pattern F, the pre-diffusion layer 1633 may be formed in the multi-channel active pattern F.

In FIG. 14C, the pre-diffusion layer 1633 is not formed on the multi-channel active pattern F(IV) of the multi-channel active patterns F(IV) and F(V) not overlapping the dummy gate pattern 142, the multi-channel active pattern F(IV) overlapping the pre-liner layer 131 formed on the lateral surfaces of the dummy gate pattern 142, but aspects of the present inventive concept are not limited thereto. That is to say, as described above with reference to FIGS. 13A to 13C, a portion of the pre-diffusion layer 1633 may overlap the pre-liner layer 131 formed on the lateral surfaces of the dummy gate pattern 142.

When the pre-diffusion layer 1633 is formed in the multi-channel active pattern F, at least a portion of the impurity supply layer 133 formed on the pre-liner layer 131 may be removed. That is to say, at least a portion of the impurity supply layer 133, which is not diffused into the pre-liner layer 131 and the multi-channel active pattern F, may be removed through a first thermal process 1651.

In addition, when the pre-diffusion layer 1633 is formed in the multi-channel active pattern F, a thickness of the pre-liner layer 131 formed on the multi-channel active pattern may be reduced. In detail, the pre-diffusion layer 1633 formed on the top surface of the multi-channel active pattern F may be thinner than the pre-liner layer 131 formed on the lateral surfaces of the multi-channel active pattern F. In addition, the thickness of the pre-liner layer 131 formed on the lateral surfaces of the multi-channel active pattern F may not substantially change.

The first thermal process 1651 performed at a lower temperature than a subsequent second thermal process is a drive-in thermal process for injecting the first impurity included in the impurity supply layer 133 into the multi-channel active pattern F. In the fabricating method of the semiconductor device according to the embodiment of the present inventive concept, arsenic and arsenic oxide are diffused into the multi-channel active pattern F through the first thermal process 1651. In the first thermal process 1651, a solid phase epitaxy rate of the multi-channel active pattern F having a broken crystal lattice due to PAI can be controlled, thereby controlling the junction depth and activation rate of the diffusion layer.

Figure 15A:
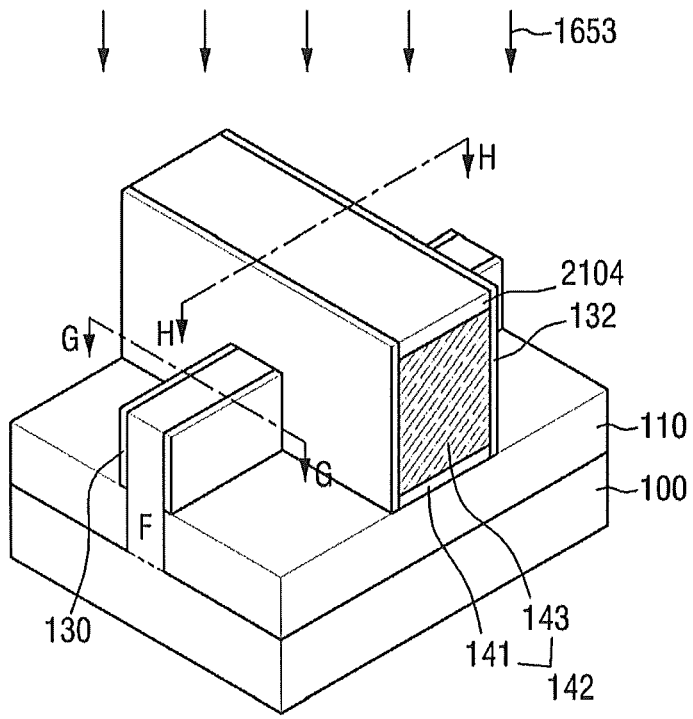
Figure 15A:
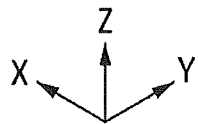
Figure 15B:
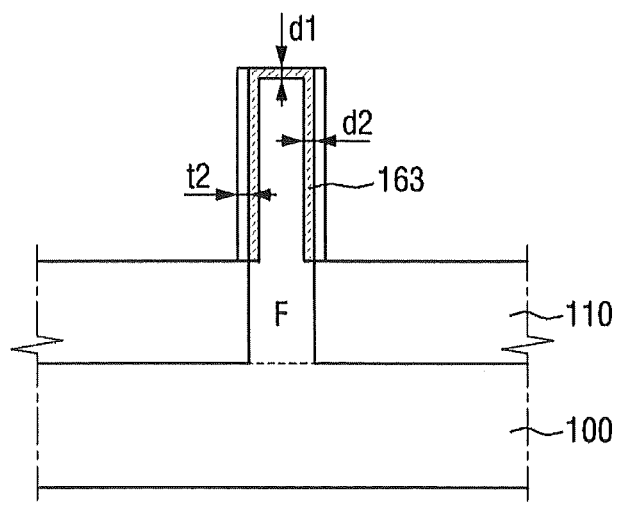
Figure 15C:
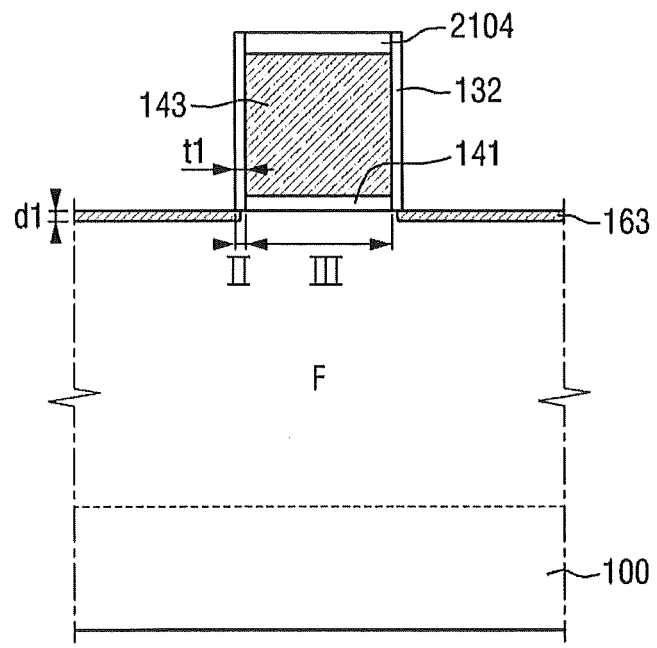

Referring to FIGS. 15A to 15C, a second thermal process 1653 is performed on the impurity supply layer 133 and the pre-diffusion layer 1633 at a second temperature higher than the first temperature at which the first thermal process 1651 is performed. As the result of the second thermal process 1653, the diffusion layer 163 is formed in the multi-channel active pattern F along the outer peripheries of the multi-channel active patterns F(IV) and F(V) not overlapping the dummy gate pattern 142.

The diffusion layer 163 may be formed by diffusing the first impurity included in the pre-diffusion layer 1633 and the first impurity included in the impurity supply layer 133 into the multi-channel active pattern F. That is to say, arsenic included in the pre-diffusion layer 1633 and arsenic included in the impurity supply layer 133 are diffused into the multi-channel active pattern F, thereby forming arsenic-doped diffusion layer 163.

In detail, the second temperature at which the second thermal process 1653 is performed may be higher than the first temperature at which the first thermal process 1651 is performed. The second temperature at which the second thermal process 1653 is performed may be a temperature at which arsenic included in the pre-diffusion layer 1633 and arsenic included in the impurity supply layer 133 may be diffused into the multi-channel active pattern F. In addition, the second temperature may be a temperature at which the impurity supply layer 133 remaining after arsenic and arsenic oxide are diffused into multi-channel active pattern F may be sublimated. In detail, the second temperature at which the second thermal process 1653 is performed may be 1000° C. or higher.

The second thermal process 1653 may be, for example, spike rapid thermal annealing (RTA), flash RTA and/or laser annealing.

During the second thermal process 1653, the pre-liner layer 131 formed on the top surface of the multi-channel active pattern F and on the top surface of the dummy gate pattern 142 may be removed. As the result, the first liner 132 is formed on the lateral surfaces of the dummy gate pattern 142, and the second liner 130 is formed on the lateral surfaces of the multi-channel active pattern F. Since the first liner 132 and the second liner 130 are derived from the pre-liner layer 131, the first impurity may be included throughout entire layers of the first liner 132 and the second liner 130.

Additionally, after performing the second thermal process 1653, if residues, such as a silicon-oxygen-arsenic compound, remain on the top surface of the multi-channel active pattern F and on the second liner 130, the residues may be subjected to ashing/stripping. In performing the ashing/stripping after performing the second thermal process 1653, the second thermal process 1653 and the ashing/stripping may be successively performed.

The diffusion layer 163 formed in the multi-channel active pattern F is formed on the top surface of the multi-channel active pattern F to a first depth d1 and on the lateral surfaces of the multi-channel active pattern F to a second depth d2. Since the diffusion layer 163 formed in the multi-channel active pattern F is formed to a uniform depth along the outer periphery of the multi-channel active pattern F, the first depth d1 and the second depth d2 may be substantially the same with each other.

In addition, since the diffusion layer 163 is formed by partial diffusion of arsenic included in the pre-diffusion layer 163, the depth d1 of the diffusion layer 163 may be greater than the depth d3 of the pre-diffusion layer 1633.

The diffusion layer 163 may extend into the pre-liner layer 131 formed on the lateral surfaces of the dummy gate pattern 142, that is, the multi-channel active pattern F(II) overlapping the first liner 132.

Figure 16:
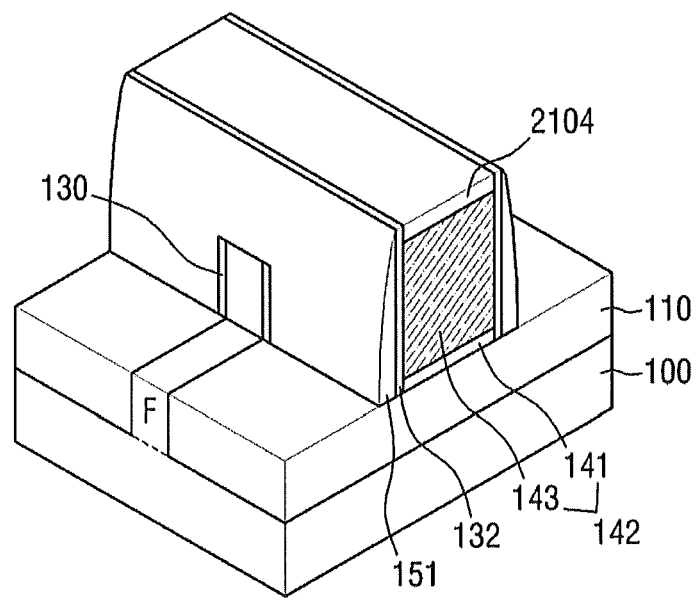
Figure 16:
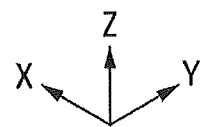

Referring to FIG. 16, a spacer 151 is formed on the lateral surfaces of the dummy gate pattern 142. That is to say, the spacer 151 is formed on the first liner 132 and portions of the lateral surfaces of the second liner 130.

In detail, an insulation layer is formed on the resultant structure having the dummy gate pattern 142, the first liner 132 and the second liner 130, followed by performing an etch-back process, thereby forming the spacer 151. The spacer 151 may expose a top surface of the mask pattern 2104 and a top surface of the multi-channel active pattern F. The spacer 151 may include, for example, silicon nitride or silicon oxynitride.

Next, portions of the multi-channel active pattern F exposed to both sides of the dummy gate pattern 142 are removed, thereby forming a recess. In the illustrated embodiment, the top surface of the multi-channel active pattern F exposed by the isolation layer 110 is positioned on the same plane as the top surface of the isolation layer 110, but aspects of the present inventive concepts are not limited thereto. That is to say, the top surface of the multi-channel active pattern F exposed by the isolation layer 110 may be recessed toward the substrate 100 relative to the top surface of the isolation layer 110.

The portions of the multi-channel active pattern F exposed to both sides of the dummy gate pattern 142 are removed, thereby exposing the second liner 130 from the spacer 151.

Figure 17:
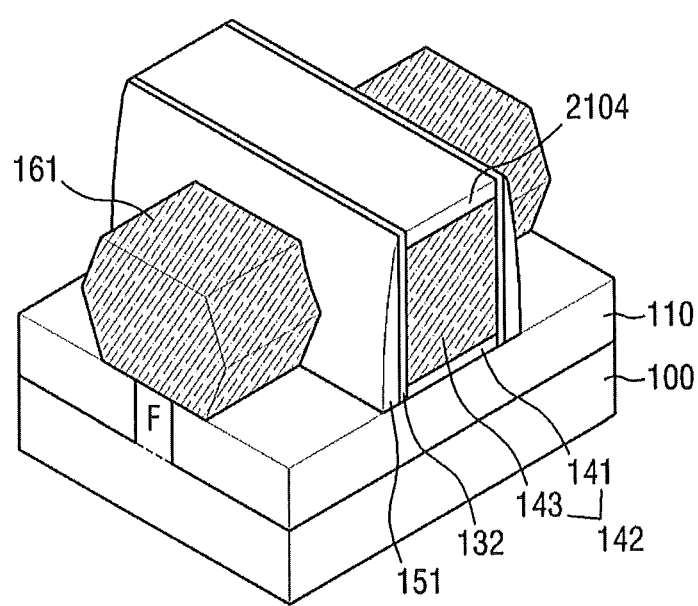

Referring to FIG. 17, a source/drain 161 is formed on the multi-channel active pattern F exposed to both sides of the dummy gate pattern 142.

The source/drain 161 may be formed by an epitaxial process. Materials for forming the source/drain 161 may vary according to whether the semiconductor device according to the embodiment of the present inventive concepts is an n type transistor or a p type transistor. In addition, impurities may be in situ doped during the epitaxial process as necessary.

In the illustrated embodiment, the source/drain 161 is shaped of a hexahedron, but aspects of the present inventive concepts are not limited thereto. That is to say, processing conditions of the epitaxial process for forming the source/drain 161 are controlled, thereby forming the source/drain 161 in various shapes, including, for example, a diamond, a circle, a tetragon or a pentagon or any other polygonal or ellipsoidal shape.

Figure 18:
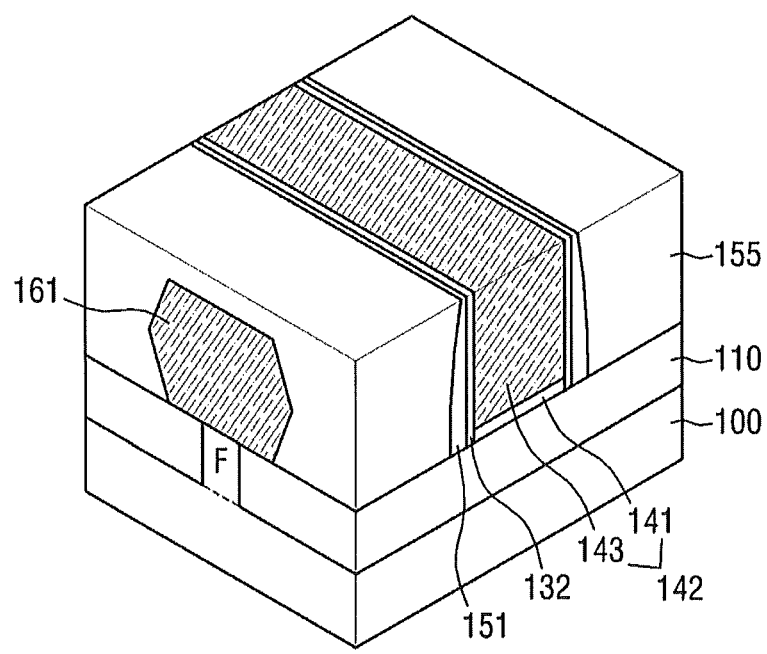

Referring to FIG. 18, an interlayer dielectric film 155 is formed on the resultant product having the source/drain 161. The interlayer dielectric film 155 may include oxide, nitride, and/or oxynitride.

Next, the interlayer dielectric film 155 is planarized until the top surface of the dummy gate pattern 142 is exposed. As the result, the mask pattern 2104 is removed, and the top surface of the dummy gate pattern 142 may be exposed.

Figure 19:
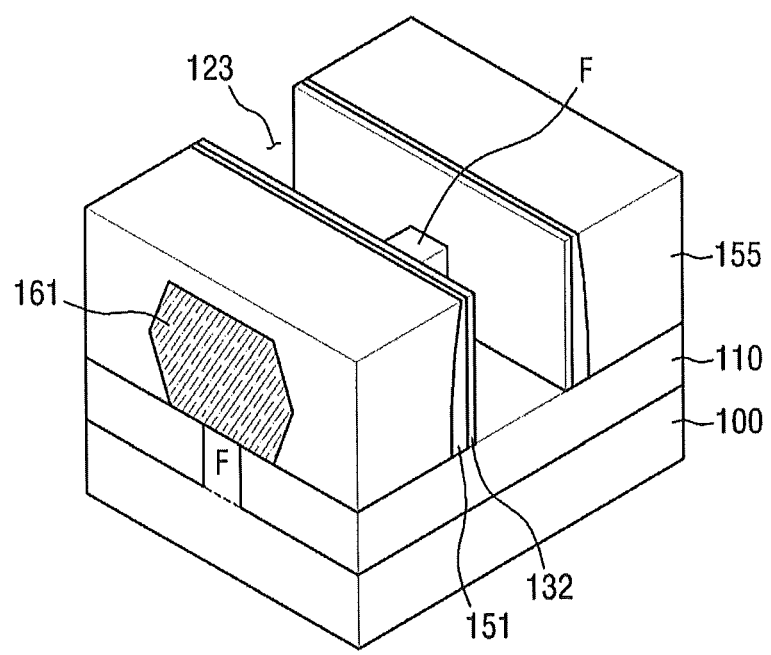

Referring to FIG. 19, a dummy gate pattern 142, that is, a dummy gate insulation layer 141 and a dummy gate electrode 143, is removed.

As the dummy gate insulation layer 141 and the dummy gate electrode 143 are removed, a trench 123, exposing portions of the isolation layer 110 and the multi-channel active pattern F, is formed.

Figure 20:
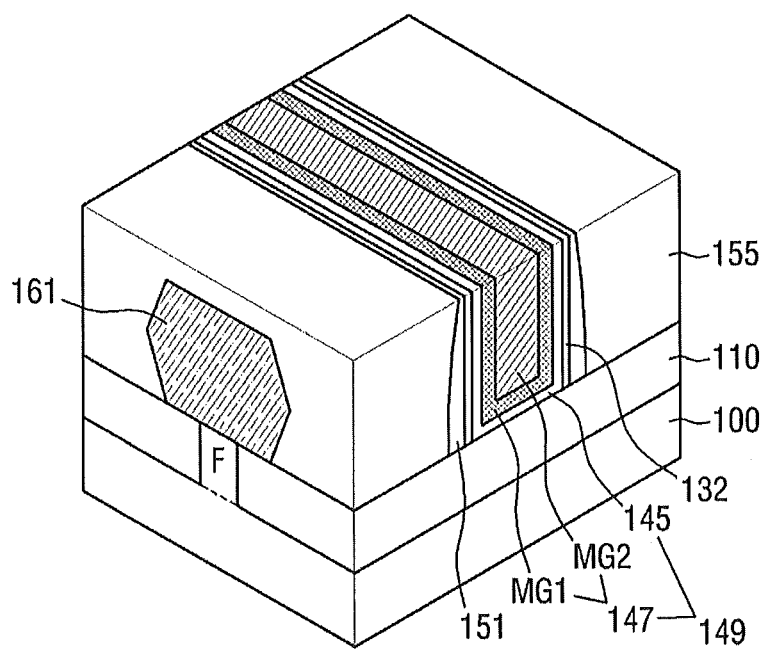

Referring to FIG. 20, a gate insulation layer 145 and a gate electrode 147 are formed in the trench 123, thereby forming the gate pattern 149.

The gate insulation layer 145 may include a high-k dielectric material having a higher dielectric constant than a silicon oxide layer. The gate insulation layer 145 may be substantially conformally formed along sidewalls and bottom surface of the trench 123.

The gate electrode 147 may include first and second metal gate layers MG1 and MG2. As shown in FIG. 20, the gate electrode 147 may have a stacked structure including two or more metal gate layers MG1 and MG2. The first metal gate layer MG1 serves to adjust a work function, and the second metal gate layer MG2 serves to fill a space formed by first metal gate layer MG1. For example, the first metal gate layer MG1 may include TiN, TaN, TiC, and/or TaC, and the second metal gate layer MG2 may include W and/or Al. The gate electrode 147 may include a non-metal material, such as Si, SiGe, etc.

Next, a method for fabricating a semiconductor device according to another embodiment of the present inventive concepts will be described with reference to FIGS. 1, 9 to 12 and 14A to 23. The present embodiment is substantially the same as the previous embodiment, except for a thickness of a pre-liner layer. Thus, the same functional components as those of the previous embodiment are denoted by the same reference numerals, and a detailed description thereof will be briefly made or omitted.

Figure 21:
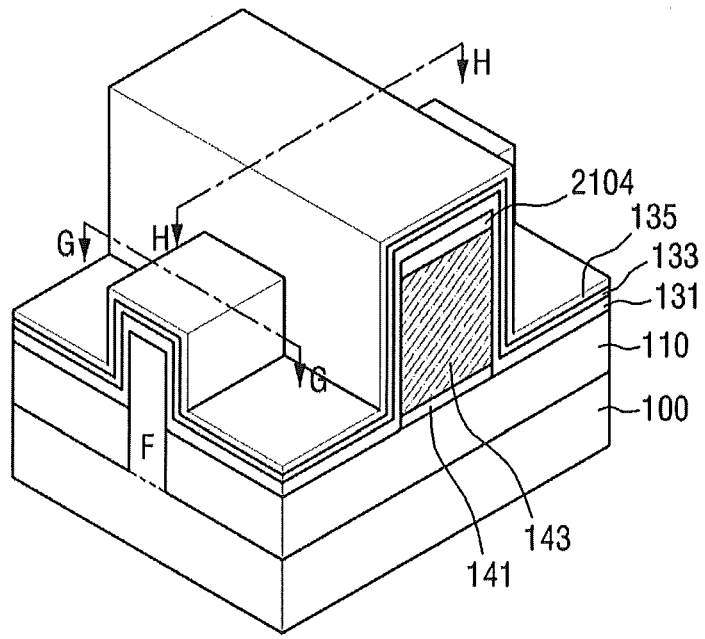
FIGS. 21 to 23 illustrate intermediate process steps for explaining a method for fabricating a semiconductor device according to another embodiment of the present inventive concepts.
Figure 21:
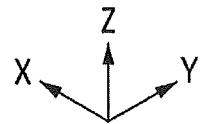
Figure 22:
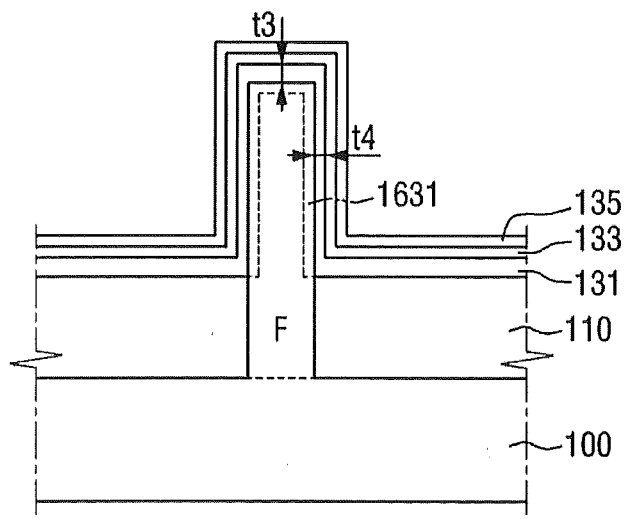
Figure 23:
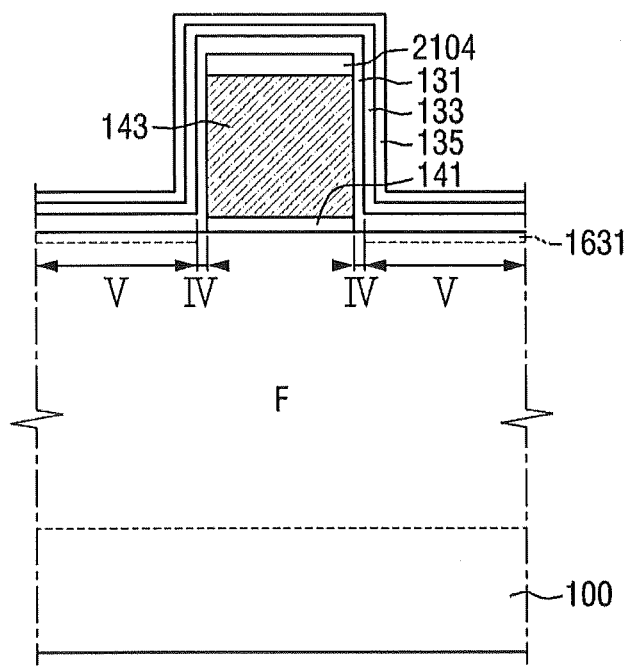

FIGS. 21 to 23 illustrate intermediate process steps for explaining a method for fabricating a semiconductor device according to another embodiment of the present inventive concepts. Specifically, FIG. 22 is a cross-sectional view taken along the line G-G of FIG. 21, and FIG. 23 is a cross-sectional view taken along the line H-H of FIG. 21.

Referring to FIGS. 21 to 23, a pre-liner layer 131 and an impurity supply layer 133 may be sequentially formed on top surfaces of the multi-channel active patterns F(IV) and F(V) not overlapping the dummy gate patterns 141 and 143. The pre-liner layer 131 and the impurity supply layer 133 may also be formed on lateral surfaces of the multi-channel active patterns F(IV) and F(V) not overlapping the dummy gate patterns 141 and 143. In addition, the pre-liner layer 131 and the impurity supply layer 133 may be formed on the lateral surfaces of the dummy gate patterns 141 and 143. A byproduct layer 135 may further be formed on the impurity supply layer 133.

A fourth thickness t4 of the pre-liner layer 131 formed on the lateral surfaces of the dummy gate patterns 141 and 143 and on the lateral surfaces of the multi-channel active pattern F may be different from a third thickness t3 of the pre-liner layer 131 formed on the top surface of the multi-channel active pattern F. In the fabricating method of the semiconductor device according to the embodiment of the present inventive concepts, the third thickness t3 of the pre-liner layer 131 may be greater than the fourth thickness t4 of the pre-liner layer 131.

After forming the pre-liner layer 131, a PAI process may be performed. As the result of the PAI process, an outer peripheral portion of the multi-channel active pattern (F(V)) not overlapping the dummy gate patterns 141 and 143 may be amorphized. Thereafter, the impurity supply layer 133 may be formed on the multi-channel active pattern F and the dummy gate patterns 141 and 143. Since the process of forming the impurity supply layer 133 is substantially the same as described with reference to FIGS. 13A to 13C, a detailed description thereof will be omitted.

Next, a diffusion layer 163 is formed along the outer periphery of the multi-channel active pattern F not overlapping the dummy gate patterns 141 and 143 by performing a first thermal process 1651 and a second thermal process 1653. After forming the diffusion layer 163, a spacer 151, a source/drain 161 and a gate pattern 149 may be sequentially formed.

Next, a method for fabricating a semiconductor device according to another embodiment of the present inventive concepts will be described with reference to FIGS. 1, 9 to 12 and 14A to 20 and 24 to 26. The present embodiment is substantially the same as the previous embodiment, except for a thickness of a pre-liner layer.

Figure 24:
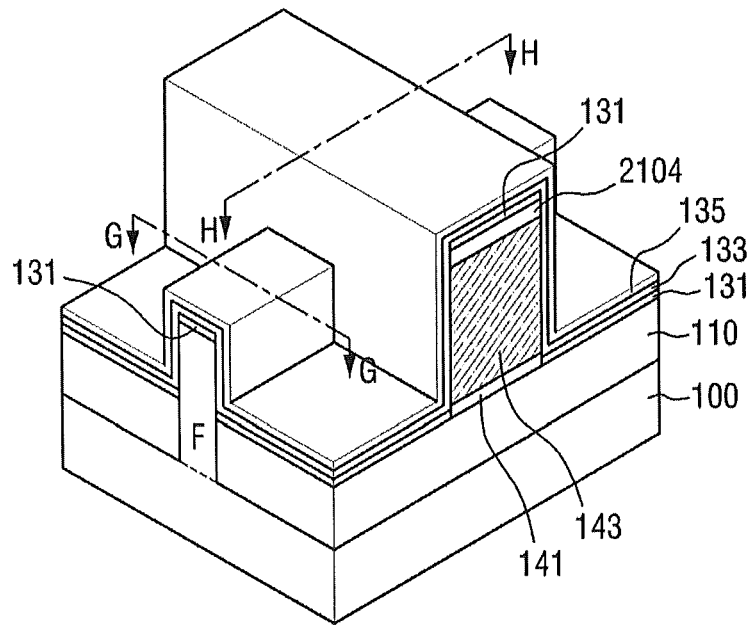
FIGS. 24 to 26 illustrate intermediate process steps for explaining a method for fabricating a semiconductor device according to another embodiment of the present inventive concepts.
Figure 24:
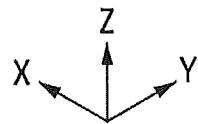
Figure 25:
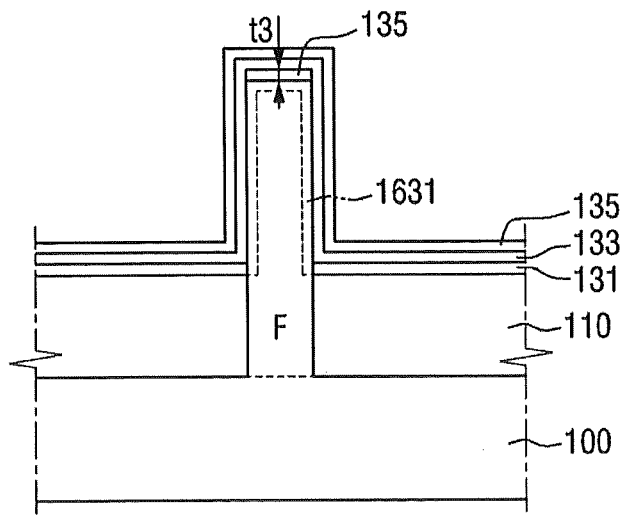
Figure 26:
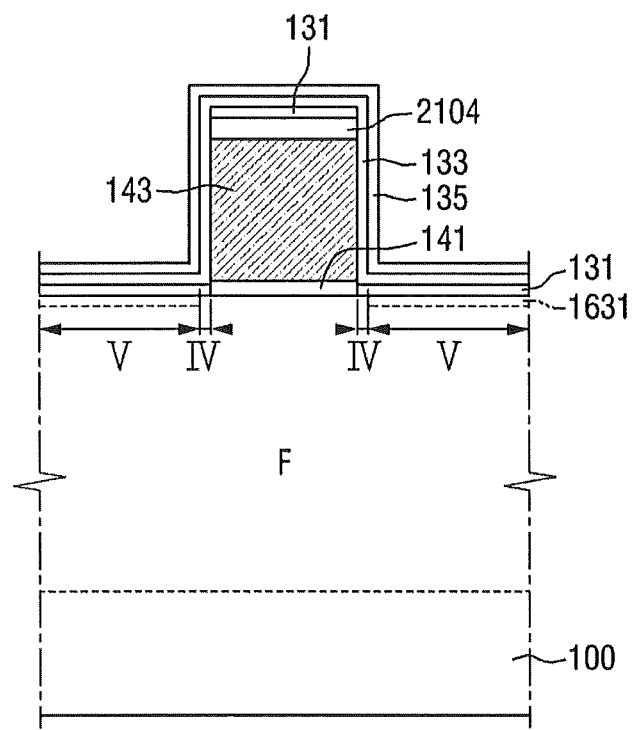

FIGS. 24 to 26 illustrate intermediate process steps for explaining a method for fabricating a semiconductor device according to another embodiment of the present inventive concepts. Specifically, FIG. 25 is a cross-sectional view taken along the line G-G of FIG. 24, and FIG. 26 is a cross-sectional view taken along the line H-H of FIG. 24.

Referring to FIGS. 24 to 26, a pre-liner layer 131 and an impurity supply layer 133 may be sequentially formed on top surfaces of the multi-channel active patterns F(IV) and F(V) not overlapping the dummy gate patterns 141 and 143. Unlike in the previous embodiment, the pre-liner layer 131 is not formed on lateral surfaces of the dummy gate patterns 141 and 143 and lateral surfaces of the multi-channel active pattern F. However, the impurity supply layer 133 is also formed on the lateral surfaces of the multi-channel active patterns F(IV) and F(V) not overlapping the dummy gate patterns 141 and 143.

After forming the pre-liner layer 131, a PAI process may be performed. As the result of the PAI process, an outer peripheral portion of the multi-channel active pattern (F(V)) not overlapping the dummy gate patterns 141 and 143 may be amorphized. Thereafter, the impurity supply layer 133 may be formed on the multi-channel active pattern F and the dummy gate patterns 141 and 143. Since the process of forming the impurity supply layer 133 is substantially the same as described with reference to FIGS. 13A to 13C, a detailed description thereof will be omitted.

Next, a diffusion layer 163 is formed along the outer periphery of the multi-channel active pattern F not overlapping the dummy gate patterns 141 and 143 by performing a first thermal process 1651 and a second thermal process 1653. After forming the diffusion layer 163, a spacer 151, a source/drain 161 and a gate pattern 149 may be sequentially formed.

Figure 27:
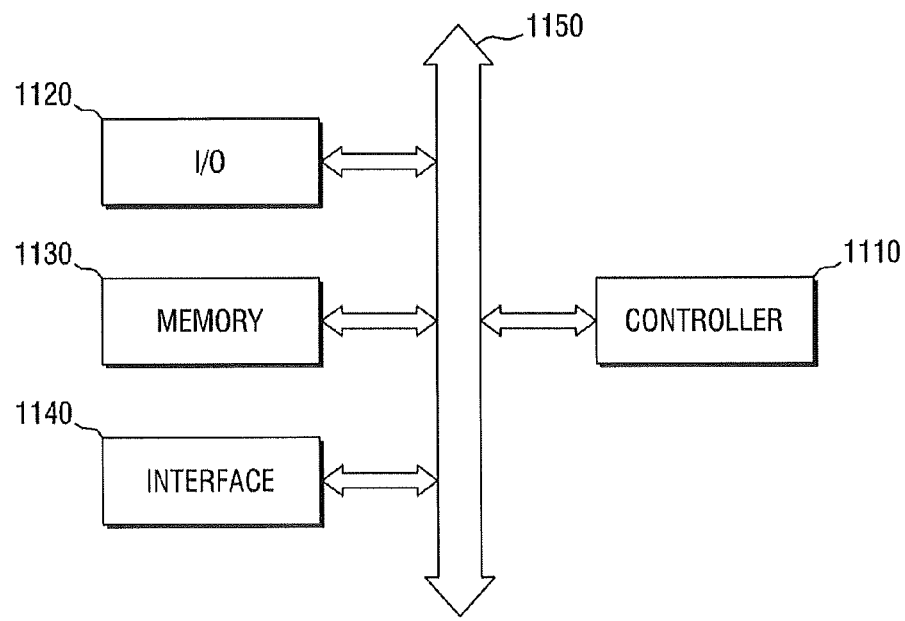
FIG. 27 is a block diagram of an electronic system including a semiconductor device according to an embodiment of the present inventive concepts.

FIG. 27 is a block diagram of an electronic system including a semiconductor device according to an embodiment of the present inventive concepts.

Referring to FIG. 27, the electronic system 1100 may include a controller 1110, an input/output device (I/O) 1120, a memory 1130, an interface 1140, and a bus 1150. The controller 1110, the I/O 1120, the memory 1130 and/or the interface 1140 may be connected to each other through the bus 1150. The bus 1150 corresponds to a path along which data moves.

The controller 1110 may include a microprocessor, a digital signal processor, a microcontroller, and/or logic devices capable of performing functions similar to those of these components. The I/O 1120 may include a keypad, a keyboard, a display, and so on. The memory 430 may store data and/or commands.

The interface 1140 may transmit data to a communication network or receive data from the communication network. The interface 1140 may be wired or wireless. For example, the interface 1140 may include an antenna or a wired/wireless transceiver. The electronic system 1100 may be an operating memory for improving the operation of the controller 410 and may further include a high-speed DRAM and/or SRAM.

A fin field effect transistor according to embodiments of the present inventive concepts may be provided into the memory 1130 or may be provided as part of the controller 1110 or the I/O 1120 or the interface 1140.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 28:
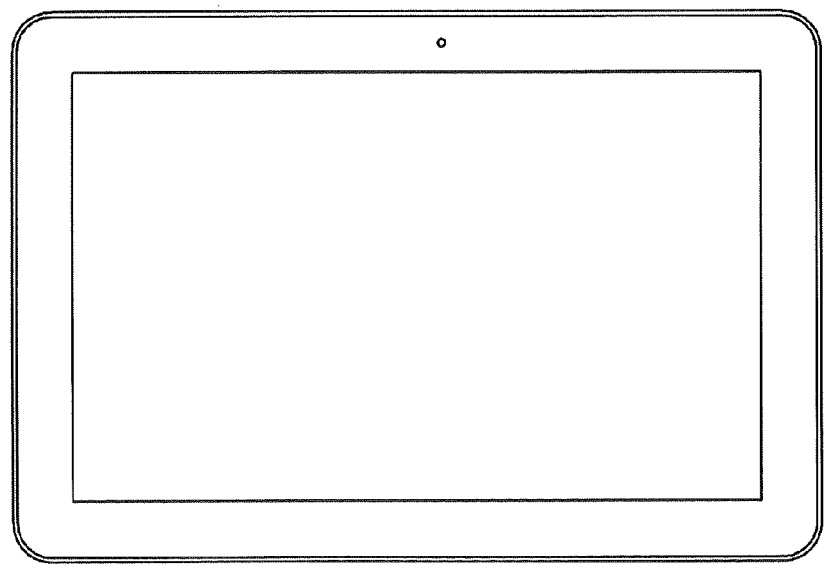
FIGS. 28 and 29 illustrate exemplary semiconductor systems to which the semiconductor device according to some embodiments of the present inventive concepts can be applied.
Figure 29:
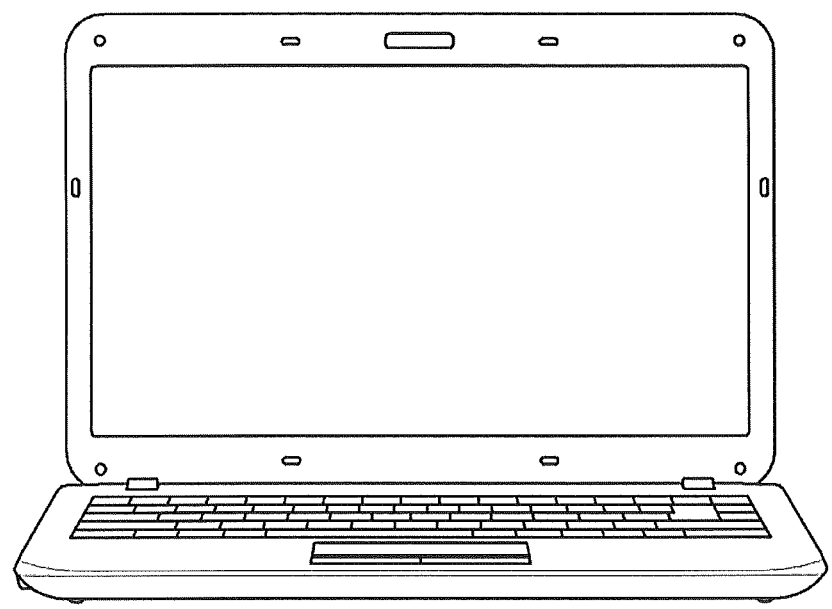

FIGS. 28 and 29 illustrate exemplary semiconductor systems to which the semiconductor device according to some embodiments of the present inventive concepts can be applied.

Specifically, FIG. 28 illustrates a tablet PC and FIG. 29 illustrates a notebook computer. At least one of the semiconductor devices according to some embodiments of the present inventive concepts can be applied to the tablet PC, a notebook computer, or the like. Moreover, at least one of the semiconductor devices according to some embodiments of the present inventive concepts can be applied to other integrated circuit devices not illustrated herein.

While the present inventive concepts has been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device comprising:
    a gate pattern on a substrate, the gate pattern including a gate insulation layer;
    multi-channel active pattern under the gate pattern to cross the gate pattern and having a first region not overlapping the gate pattern and a second region overlapping the gate pattern;
    a diffusion layer in the multi-channel active pattern along the outer periphery of the first region and including an impurity having a concentration; and
    a liner on the multi-channel active pattern, the liner extending on lateral surfaces of the first region, not extending on a top surface of the first region, not protruding above the top surface of the first region, and not extending on lateral surfaces of the second region.

2. The semiconductor device of claim 1, wherein the liner extends on the lateral surfaces of the first region at a uniform thickness.

3. The semiconductor device of claim 1, wherein the diffusion layer extends in the first region at a uniform depth.

4. The semiconductor device of claim 1, wherein the impurity includes arsenic (As), phosphorus (P), boron (B) and/or carbon (C).

5. The semiconductor device of claim 1, wherein the multichannel active pattern farther includes a third region interposed between the first region and the second region, and the diffusion layer includes an extension part in the third region.

6. The semiconductor device of claim 5, wherein the diffusion layer extends on at least a portion of the third region and the first region.

7. The semiconductor device of claim 5, wherein the extension part of the diffusion layer extends to a uniform width along the outer periphery of the third region.

8. The semiconductor device of claim 1, wherein the liner is a first liner, wherein the multi-channel active pattern further includes a third region interposed between the first region and the second region, and a second liner that extends on the third region along the outer periphery of the third region.

9. The semiconductor device of claim 8, wherein the second liner extends along lateral surfaces of the gate pattern.

10. The semiconductor device of claim 9, wherein the second liner is connected to the first liner.

11. The semiconductor device of claim 8, wherein the first liner and the second liner extend to the same level.

12. The semiconductor device of claim 11, further comprising a spacer on the first liner and a top surface of the first region.

13. The semiconductor device of claim 12, wherein the spacer is in contact with the top surface of the first region.

14. The semiconductor device of claim 1, further comprising a source/drain in contact with the first region, wherein the impurity is a first impurity and the concentration is a first concentration, and wherein the source/drain includes a second impurity having a second concentration different from the first concentration.

15. The semiconductor device of claim 14, wherein the second concentration of the second impurity is higher than the first concentration of the first impurity.

16. The semiconductor device of claim 1, wherein the multi-channel active pattern is a fin type.

17. A semiconductor device comprising:
a gate pattern on a substrate, the gate pattern including a gate insulation layer;
a multi-channel active pattern under the gate pattern to cross the gate pattern and having first and second regions not overlapping the gate pattern and a third region overlapping the gate pattern, the second region being interposed between the first region and the third region;
a diffusion layer extending along the first region and the second region, the diffusion layer having a uniform width along the outer periphery of multi-channel active pattern;
a liner extending on lateral surfaces of the first region, not extending on a top surface of the first region, not protruding above the top surface of the first region, and not extending on lateral surfaces of the third region; and
a source/drain in contact with the first region.

18. The semiconductor device of claim 17, wherein the diffusion layer extends on the first region and at least a portion of the second region.

19. The semiconductor device of claim 17, wherein the liner is a first liner, the semiconductor device further comprising a second liner overlapping the second region, wherein the second liner overlaps at least a portion of the diffusion layer.

20. The semiconductor device of claim 19, wherein the second liner is connected to the first liner.

21. A semiconductor device comprising:
an isolation layer on a substrate;
a multi-channel active pattern protruding above the isolation layer from the substrate;
a gate pattern extending on the multi-channel active pattern and the isolation layer, such that the multi-channel active pattern under the gate pattern has a first region not overlapping the gate pattern and a second region overlapping the gate pattern, the gate pattern including a gate insulating layer and a gate electrode on the gate insulating layer;
a liner on the multi-channel active pattern, the liner extending on lateral surfaces of the first region, not extending on a top surface of the first region, not protruding above the top surface of the first region, and being disposed above the isolation region; and
a spacer on the liner and a top surface of the first region, the spacer disposed on a lateral side of the gate pattern.

22. The semiconductor device of claim 21, wherein the liner does not extend on lateral surfaces of the second region.

23. The semiconductor device of claim 21, further comprising a diffusion layer in the multi-channel active pattern along the outer periphery of the first region, the diffusion layer including a first impurity having the first concentration.

24. The semiconductor device of claim 23, further comprising a source/drain in contact with the first region, the source/drain including a second impurity having a second concentration greater than the first concentration.

* * * * *